US011200000B2

(12) United States Patent
Kim et al.

(10) Patent No.: US 11,200,000 B2
(45) Date of Patent: Dec. 14, 2021

(54) MEMORY CONTROLLER AND STORAGE DEVICE INCLUDING THE SAME

(71) Applicant: SAMSUNG ELECTRONICS CO., LTD., Suwon-si (KR)

(72) Inventors: Youngwook Kim, Hwaseong-si (KR); Dongeun Shin, Seoul (KR); Wansoo Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/799,213

(22) Filed: Feb. 24, 2020

(65) Prior Publication Data

US 2021/0019087 A1    Jan. 21, 2021

(30) Foreign Application Priority Data

Jul. 17, 2019   (KR) .......................... 10-2019-0086349

(51) Int. Cl.
*G06F 3/00*    (2006.01)
*G06F 3/06*    (2006.01)
(Continued)

(52) U.S. Cl.
CPC .......... *G06F 3/0659* (2013.01); *G06F 3/0604* (2013.01); *G06F 3/0673* (2013.01); *G11C 16/0483* (2013.01); *G11C 16/26* (2013.01)

(58) Field of Classification Search
CPC .. G11C 16/08; G11C 5/14; G11C 7/02; G11C 16/16; G11C 29/78; G11C 8/12; G11C 8/20; G11C 16/0483; G11C 8/10; G11C 11/5628; G11C 11/5642; G11C 16/10; G11C 16/26; G06F 1/3206; G06F 1/3287; G06F 3/0604; G06F 3/0659; G06F 3/0673; G06F 3/0602; G06F 3/061; G06F 3/0614; H01L 27/105; H01L 27/115; H01L 27/11526; H01L 27/11529; H01L 27/11546
(Continued)

(56) References Cited

U.S. PATENT DOCUMENTS 10,120,589 B2    11/2018  Jung
2010/0074035 A1*   3/2010  Do .......................... G11C 7/106
                                                    365/189.14
(Continued)

FOREIGN PATENT DOCUMENTS

KR   10-2014-0103048 A    8/2014

*Primary Examiner* — Thong Q Le
(74) *Attorney, Agent, or Firm* — Sughrue Mion, PLLC

(57) ABSTRACT

A storage device includes a memory device including a plurality of memory cells respectively storing data having a plurality of bits, and a memory controller including an operation block including a plurality of unit circuits executing a predetermined function, and a core block executing a control operation on the plurality of memory cells in response to a command from a host. The core block selects at least portions of the plurality of unit circuits to determine selection unit circuits, and generates a control command specifying an operation order of the selection unit circuits. In the operation block, the selection unit circuits operate by the operation order to determine a control voltage required for the control operation, and store the control voltage in at least one of the memory controller or the memory device.

20 Claims, 19 Drawing Sheets

(51) Int. Cl.
*G11C 16/26* (2006.01)
*G11C 16/04* (2006.01)

(58) Field of Classification Search
USPC .... 365/230.03, 230.06, 226, 185.09, 185.11,
365/185.29, 63, 185.12, 185.23, 185.33,
365/194, 200, 230.08, 238.5, 51, 145,
365/189.07, 222, 227, 230.01; 711/119,
711/149
See application file for complete search history.

(56) References Cited

U.S. PATENT DOCUMENTS

| | | |
|---|---|---|
| 2014/0237162 A1 | 8/2014 | Brewer et al. |
| 2015/0242308 A1 | 8/2015 | Kim et al. |
| 2018/0188983 A1 | 7/2018 | Fleming, Jr. et al. |
| 2018/0219797 A1 | 8/2018 | Sen et al. |
| 2018/0342305 A1 | 11/2018 | Cha et al. |
| 2019/0068222 A1 | 2/2019 | Lee |
| 2019/0108152 A1 | 4/2019 | Lee |

\* cited by examiner

| SQ | 0 | QID | | DATA0 | |
|---|---|---|---|---|---|
| | | DATA1 | | | |
| | 1 | FUNCTION 7 | FUNCTION 6 | FUNCTION 5 | FUNCTION 4 |
| | | FUNCTION 3 | FUNCTION 2 | FUNCTION 1 | FUNCTION 0 |

FIG. 8A

| CQ | 0 | QID | DATA0 |
|---|---|---|---|
| | | DATA1 | |

FIG. 8B

| SQ | 0 | QID:0 | | | DATA0:0.8k |
|---|---|---|---|---|---|
| | | DATA1:INIT1~INIT15 | | | |
| | 1 | | | | F6 |
| | | F2 | F1 | F4 | F5 |

FIG. 9

| CQ | 0 | QID:0 | DATA0(0.8k) |
|---|---|---|---|
| | | DATA1:INIT1~INIT15 | |

1

MEMORY CONTROLLER AND STORAGE DEVICE INCLUDING THE SAME

CROSS-REFERENCE TO RELATED APPLICATION(S)

This application claims priority from Korean Patent Application No. 10-2019-0086349 filed on Jul. 17, 2019 in the Korean Intellectual Property Office, the entire disclosure of which is incorporated by reference herein for all purposes.

BACKGROUND

Example embodiments of the present disclosure relate to a memory controller and a storage device including the same.

Storage devices are devices capable of storing data on flash memories having nonvolatile characteristics, and may be implemented as solid state drive (SSD) devices or the like. Storage devices are used in various fields, such as by individual users, as well as servers. A storage device may include a memory controller controlling a memory device in addition to the memory device that stores data. Recently, memory controllers may include hardware accelerators to improve the performance of storage devices. However, in the case in which a hardware accelerator is used, when the memory device is changed, a problem may arise in that the hardware accelerator should be newly designed.

SUMMARY

Example embodiments provide a memory controller, in which unit circuits executing a predetermined function are implemented on a hardware level and a core block selects at least portions of the unit circuits and adjusts the order of execution of selection unit circuits, such that the memory controller may be applied to various memory devices, and a storage device including the memory controller.

According to an aspect of an example embodiment, there is provided a storage device includes a memory device including a plurality of memory cells, wherein each memory cell of the plurality of memory cells is configured to store data having a plurality of bits; and a memory controller including an operation block, wherein the operation block includes a plurality of unit circuits and a core block configured to execute a control operation on the plurality of memory cells in response to a host command from a host, and each unit circuit of the plurality of unit circuits is configured to execute a predetermined function. The core block is configured to select at least a portion of the plurality of unit circuits as selection unit circuits, and generate a control command specifying an operation order of the selection unit circuits. The selection unit circuits are configured to operate by the operation order to determine a control voltage required for the control operation on the plurality of memory cells, and store the control voltage in at least one of the memory controller or the memory device.

According to an aspect of an example embodiment, there is provided a storage device includes a memory device including a plurality of memory cells, a plurality of word lines connected to the plurality of memory cells, and a plurality of counter tables configured to store prediction values of a first control voltage based on a number of times of use of the memory device, each memory cell of the plurality of memory cells being configured to store data having a plurality of bits; a core block configured to output a control command, the control command including initial values of a second control voltage of a target word line among the plurality of word lines and a number of times of actual use of the memory device; and an operation block configured to select, based on the number of times of actual use of the memory device, the prediction values from one counter table of the plurality of counter tables, and determine, in response to the control command, a set of values of a fourth control voltage of the target word line by adding differences between the initial values and the prediction values to reference values of a third control voltage of a reference word line.

According to an aspect of an example embodiment, there is provided a memory controller includes a core block configured to sequentially output commands including a first control command for adjusting a first control voltage with respect to a first selected memory cell among a plurality of memory cells, and a second control command for adjusting a second control voltage with respect to a second selected memory cell among the plurality of memory cells; and an operation block including a first unit circuit configured to, in response to the first control command, execute a first operation during a first operation time, and a second unit circuit configured to execute, in response to the second control command, a second operation different from the first operation during the first operation time of executing the first operation by the first unit circuit.

BRIEF DESCRIPTION OF DRAWINGS

The above and other aspects, features, and advantages of the present disclosure will be more clearly understood from the following detailed description, taken in conjunction with the accompanying drawings, in which:

FIGS. 8A and 8B are diagrams illustrating commands generated in a memory controller according to an example embodiment;

FIGS. 9 to 17 are diagrams illustrating operations of a storage device according to an example embodiment; and FIGS. 18 to 21 are drawings illustrating operations of a memory controller included in a storage device according to an example embodiment.

DETAILED DESCRIPTION

Hereinafter, example embodiments will be described with reference to the accompanying drawings.

Figure 1:
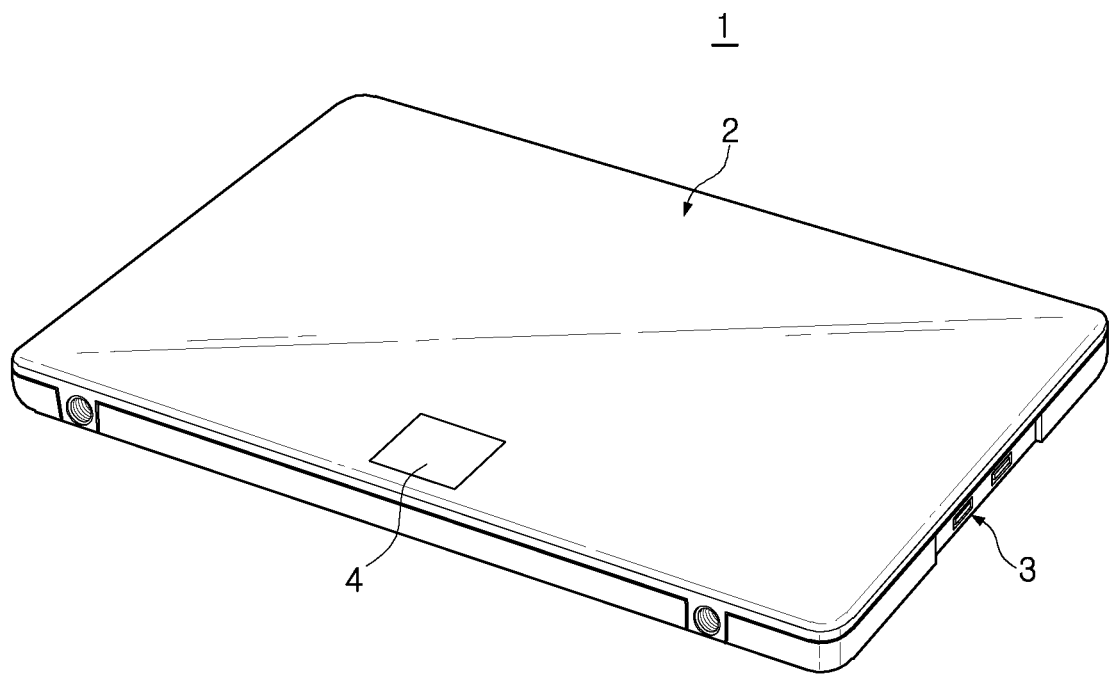
FIG. 1 is a view illustrating the appearance of a storage device according to an example embodiment.

FIG. 1 is a view illustrating the appearance of a storage device according to an example embodiment.

Referring to FIG. 1, a storage device 1 according to an example embodiment may be an external storage device connected to an external interface of a host and may be a solid state drive (SSD) device including a nonvolatile memory. The storage device 1 may include a memory controller, a memory device including nonvolatile memory cells, an interface communicating with a host, and the like. The memory controller, the memory device and the like may be mounted in a housing 2. An interface 3 may be disposed to be exposed to one side of the housing 2.

The housing 2 of the storage device 1 may include an input/output unit 4. The input/output unit 4 may include at least one button and may include light emitting devices such as a light emitting diode (LED) packaged together with a button. When a user presses the button included in the input/output unit 4, a predetermined input command may be generated. In an example embodiment, a function such as storing data being processed in the storage device 1 in a memory device and cutting off power supplied from the host may be executed by the input command. The input/output unit 4 may inform the user of the operation state of the storage device 1, using the presence or absence of blinking of the LED, or the like. However, the configuration of the storage device 1 described above is an example and may thus be variously modified according to example embodiments.

Figure 2:
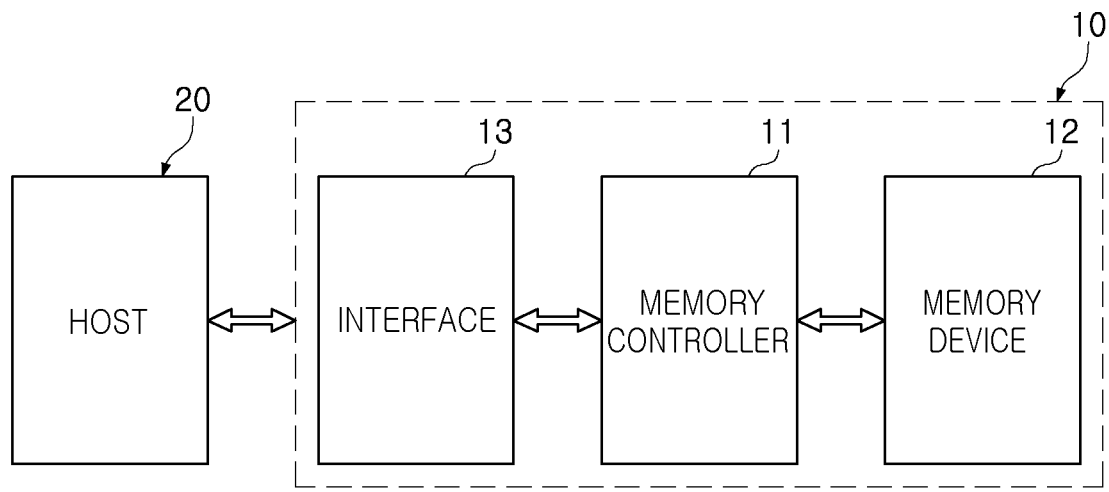
FIG. 2 is a block diagram schematically illustrating a storage device according to an example embodiment.

FIG. 2 is a schematic block diagram of a storage device according to an example embodiment.

Referring to FIG. 2, a storage device 10 according to an example embodiment may include a memory controller 11, a memory device 12 and an interface 13. The storage device 10 is connected to and operates with a host 20, and examples of the host 20 may include personal computer devices such as desktop computers or laptop computers, servers, and a variety of electronic devices to which other storage devices 10 may be connected.

The memory controller 11 controls overall operations of the storage device 10, and may write data to or read data from the memory device 12. The memory controller 11 may communicate with the host 20 through the interface 13, and may write data requested by the host 20 to the memory device 12 or read data from the memory device 12 to transmit the data to the host 20.

The memory device 12 may include a flash memory having nonvolatile characteristics. According to one or more example embodiments, the storage device 10 may further include a main memory connected between the interface 13 and the memory controller 11, and the main memory may be implemented as a dynamic random access memory.

The memory controller 11 may include various accelerators to improve performance of the memory device 12. In general, an accelerator may be implemented as hardware, but a hardware accelerator may need to be newly designed when specifications and performance of the memory device 12 are changed. For example, when a necessary function is implemented by a hardware accelerator, it may be difficult to cope with the memory device 12 having various specifications and performances. In addition, since the hardware accelerator should be implemented separately for each required function, the manufacturing cost of the memory controller 11 may increase.

In the storage device 10 according to an example embodiment, the memory controller 11 may include an operation block having a plurality of unit circuits executing a predetermined function and/or operation, and a core block controlling the memory device 12. The core block may select at least portions of the unit circuits included in the operation block to determine the selection unit circuits, and may specify an operation order of the selection unit circuits.

When the core block determines the selection unit circuits, and generates a control command that specifies the order of operation and transmits the control command to the operation block, the selection unit circuits may operate by the operation order in the operation block. In an example embodiment, the unit circuits may respectively execute various functions and/or operations, such as a shift operation, a minus operation, a plus operation, data retrieval, data writing, a maximum value operation, a minimum value operation, an intermediate value operation, and the like. Since the operation executed in the operation block is determined by the selected unit-circuits stored in the control command transmitted by the core block and the operation order thereof, the operation block may provide various accelerators required for the memory device 12. Thus, the performance of the storage device 10 may be effectively improved.

Figure 3:
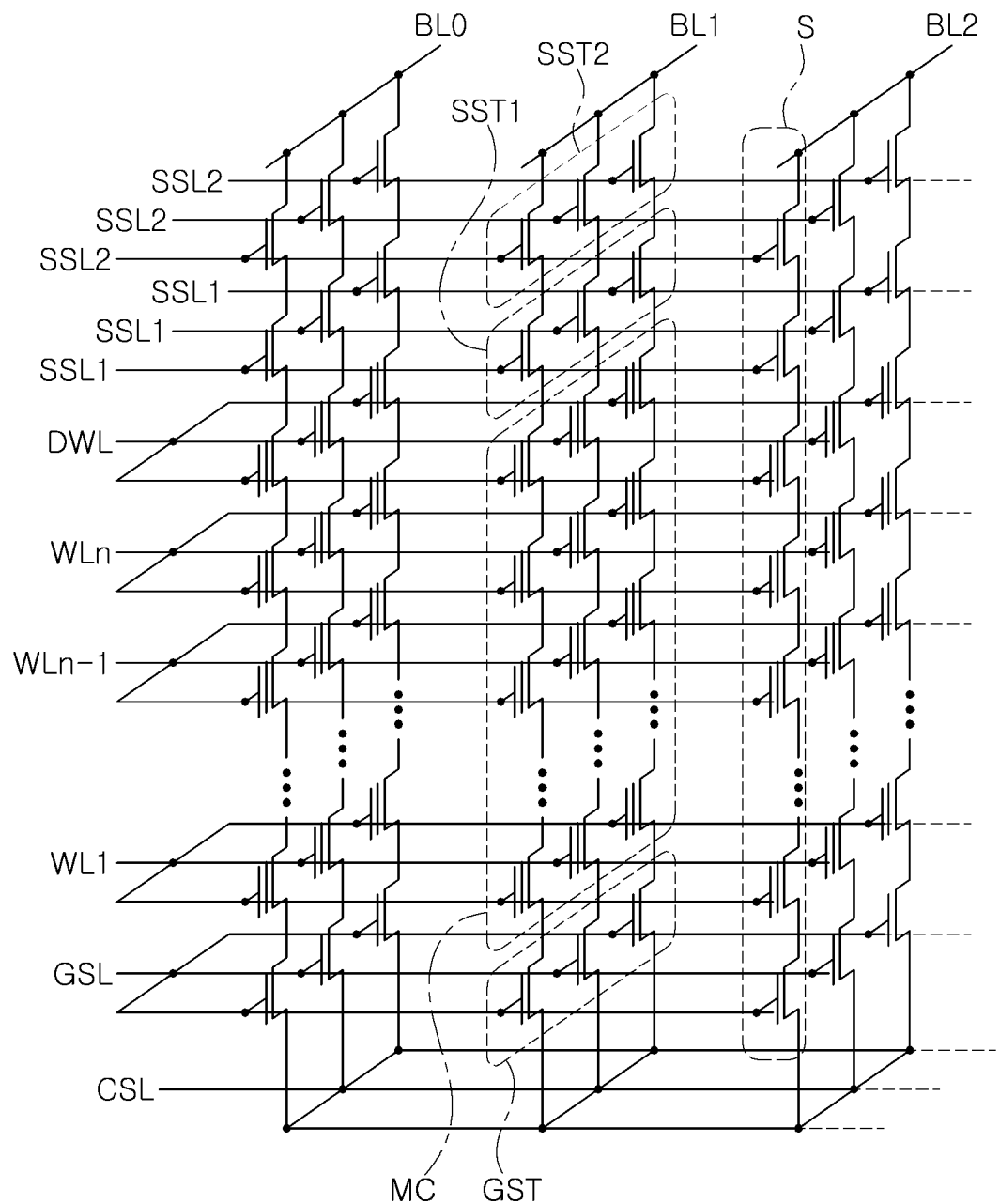
FIG. 3 is a circuit diagram schematically illustrating a memory device included in a storage device according to an example embodiment.

FIG. 3 is a schematic circuit diagram of a memory cell array of a memory device included in a storage device according to an example embodiment.

Referring to FIG. 3, a memory cell array 30 of a memory device may include a plurality of memory cell strings S including memory cells MC connected to each other in series and a ground select transistor GST and string select transistors SST1 and SST2 connected to both ends of the memory cells MC in series. At least portions of the plurality of memory cell strings S may be commonly connected to one of bit lines BL0 to BL2. The plurality of memory cell strings S may be commonly connected to a common source line CSL. For example, the plurality of memory cell strings S may be disposed between the plurality of bit lines BL0 to BL2 and one common source line CSL. In an example embodiment, in the case of the common source line CSL, a plurality of common source lines may also be disposed two-dimensionally.

The memory cells MC connected to each other in series may be controlled by word lines WL1 to WLn for selecting the memory cells MC. Each of the memory cells MC may include a data storage element. Memory cells MC disposed at substantially the same distance from the common source line CSL may be commonly connected to one of the word lines WL1 to WLn and may receive the same voltage during the operation of the memory device. Alternatively, even when the memory cells MC are disposed at substantially the same distance from the common source lines CSL, at least some memory cells MC disposed in different rows or columns may also be independently controlled.

The ground select transistor GST is controlled by a ground select line GSL and may be connected to the common source line CSL. The string select transistors SST1 and SST2 may be controlled by string select lines SSL1 and SSL2, and may be connected to the bit lines BL0 to BL2. Although FIG. 3 illustrates a structure in which each of the memory cell strings S connected to each other in series includes one ground select transistor GST and two string select transistors SST1 and SST2, an example embodiment thereof is not limited thereto.

At least one dummy line DWL or a buffer line may be disposed between an uppermost word line WLn and first string select line SSL1. In an example embodiment, a dummy line DWL or a buffer line may also be disposed between a lowermost word line WL1 and the ground select line GSL.

When signals are applied to the string select transistors SST1 and SST2 through the string select lines SSL1 and SSL2, the signals applied through the bit lines BL0 to BL2 are transferred to the memory cells MC connected to each other in series, thereby executing a data reading operation or a data programming operation. To perform the data reading operation or the data programming operation, an appropriate control voltage may also be input to the word lines WL1 to WLn. In addition, by applying a predetermined erasing voltage through a substrate, an erase operation for erasing data written to the memory cells MC may be performed. In an example embodiment, the memory cell array 30 may include at least one dummy memory cell string that is electrically separated from the bit lines BL0 to BL2.

In an example embodiment, data stored in the respective memory cells MC may be distinguished from each other depending on a threshold voltage distribution of the memory cells MC. The memory controller included in the storage device together with the memory device may determine a read voltage input to a selected word line connected to a selected memory cell in a data reading operation of reading data stored in the selected memory cell among the memory cells MC.

Two or more bits of data have recently been stored in each of the memory cells MC to improve a storage capacity of the memory device. In the case in which two or more bits of data are stored in each of the memory cells MC, a threshold voltage distribution for distinguishing data of the memory cells MC may be narrowed. The threshold voltage distribution of the memory cells MC may vary, depending on operating conditions of the memory device and the number of times of use of the memory cells MC. Therefore, to improve the operation of the memory device, the memory controller needs to dynamically adjust control voltages input to the word lines WL1 to WLn in consideration of the threshold voltage distribution.

In an example embodiment, the memory controller may include an operation block having a plurality of unit circuits executing a predetermined function and/or operation. In the operation block, selection unit circuits, which will actually operate among the unit circuits, and an operation order of the selection unit circuits, may be determined depending on control commands generated by a core block of the memory controller. The core block may generate a control command for adjusting a control voltage based on an operating condition of the memory device and the number of times of use of the memory cells MC, and transmit the control command to the operation block. The operation block may operate by the control command to adjust the control voltage.

Therefore, in an example embodiment, the memory controller may adaptively generate a control voltage optimized for the specification, performance and operating conditions of the memory device. In addition, by appropriately determining the selection unit circuits and the operation order of the selection unit circuits, an accelerator having various functions required for the memory device may be implemented.

FIGS. 4A to 4D are diagrams illustrating operations of a memory device included in a storage device according to an example embodiment.

Figure 4A:
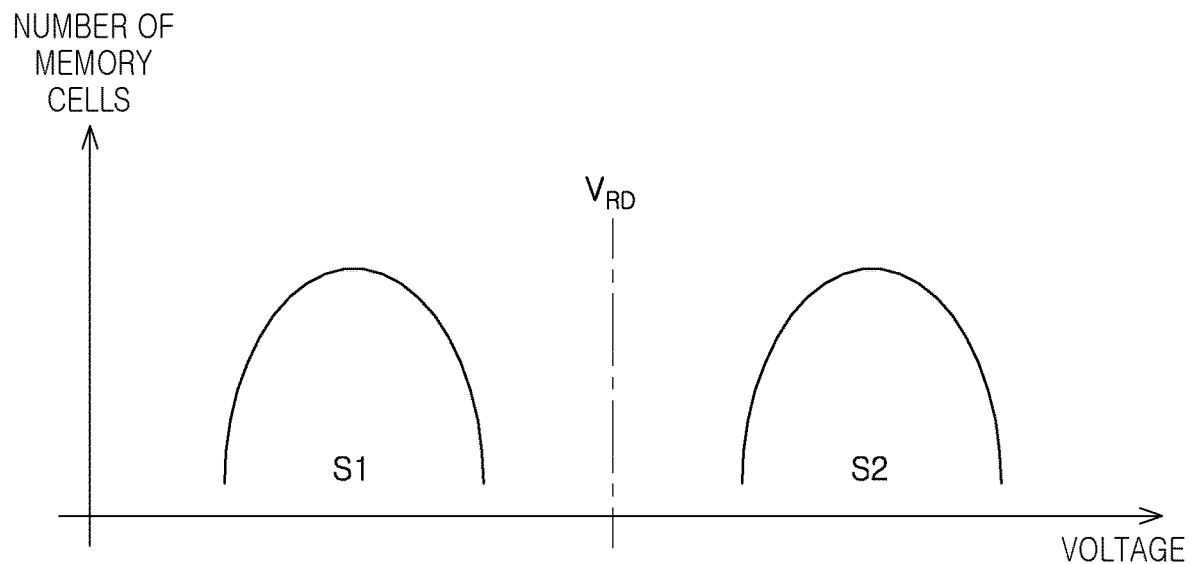
FIGS. 4A to 4D are diagrams illustrating operations of a memory device included in a storage device according to an example embodiment.

Referring to FIGS. 4A to 4D are diagrams illustrating threshold voltage distributions of memory cells depending on the number of bits of data stored in each of the memory cells included in the memory device. First, FIG. 4A is a diagram illustrating a threshold voltage distribution of memory cells in a memory device in which one bit of data is stored in each of the memory cells.

Referring to FIG. 4A, memory cells may have any one of a first state S1 and a second state S2. The first state S1 may have a voltage lower than a voltage in the second state S2. In the example embodiment illustrated in FIG. 4A, a read voltage $V_{RD}$ input to the word lines by the memory controller to perform a reading operation may be a voltage between the first state S1 and the second state S2.

Figure 4B:
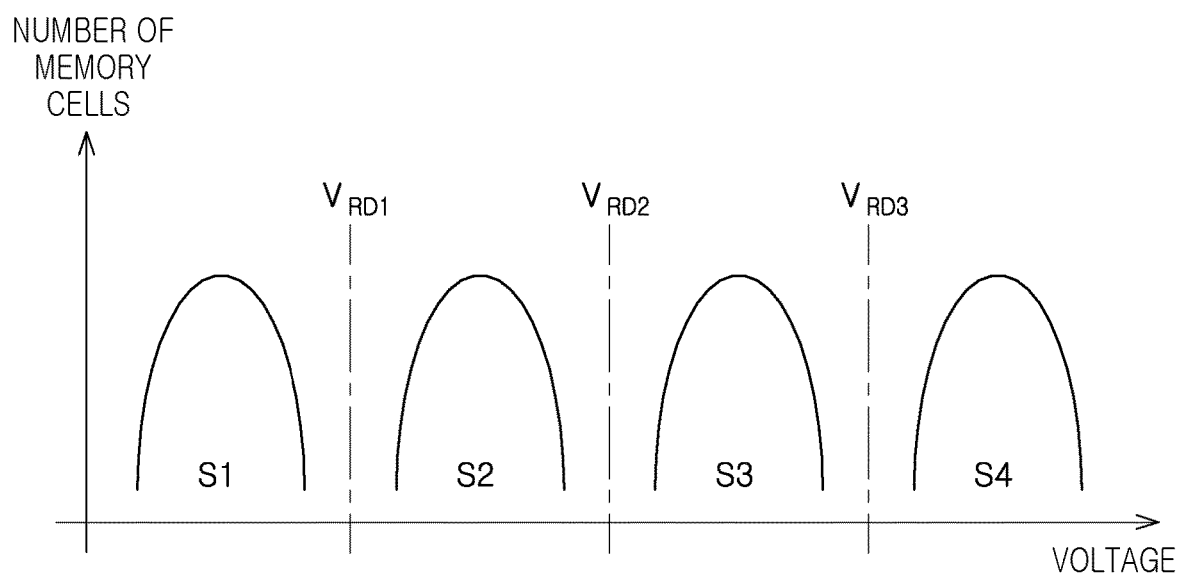

FIG. 4B may be a drawing illustrating a threshold voltage distribution of memory cells in a memory device in which two bits of data may be stored in each of the memory cells. In the example embodiment illustrated in FIG. 4B, the memory cells may have any one of first to fourth states S1 to S4. The memory controller may input, first to third read voltages $V_{RD1}$ to $V_{RD3}$ between the first to fourth states S1 to S4, to the word lines, thereby performing a reading operation.

Figure 4C:
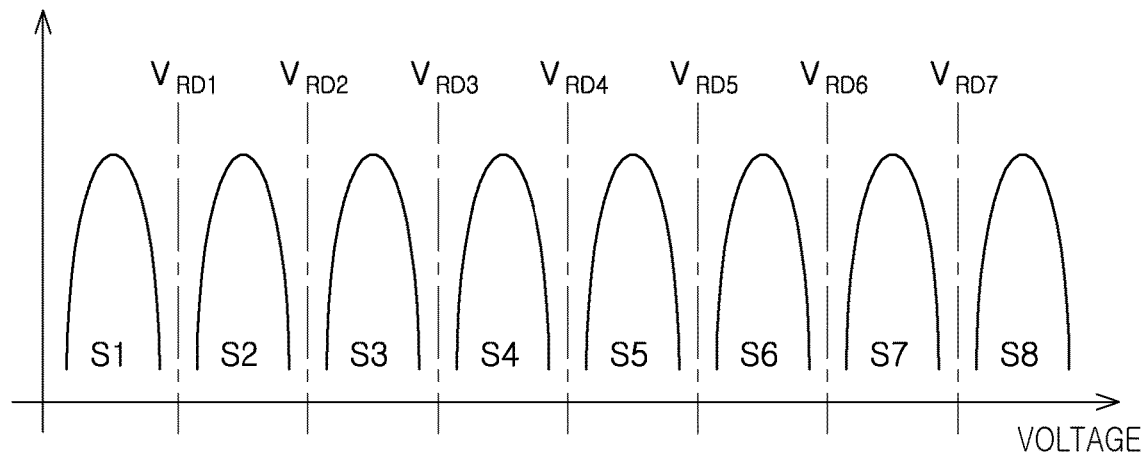

FIG. 4C is a diagram illustrating a threshold voltage distribution of memory cells in a memory device in which 3 bits of data may be stored in each of the memory cells. In the example embodiment illustrated in FIG. 4C, the memory cells may have any one of first to eighth states S1 to S8. The memory controller may perform a reading operation by inputting first to seventh read voltages $V_{RD1}$ to $V_{RD7}$ between the first to eighth states S1 to S8 to word lines.

Figure 4D:
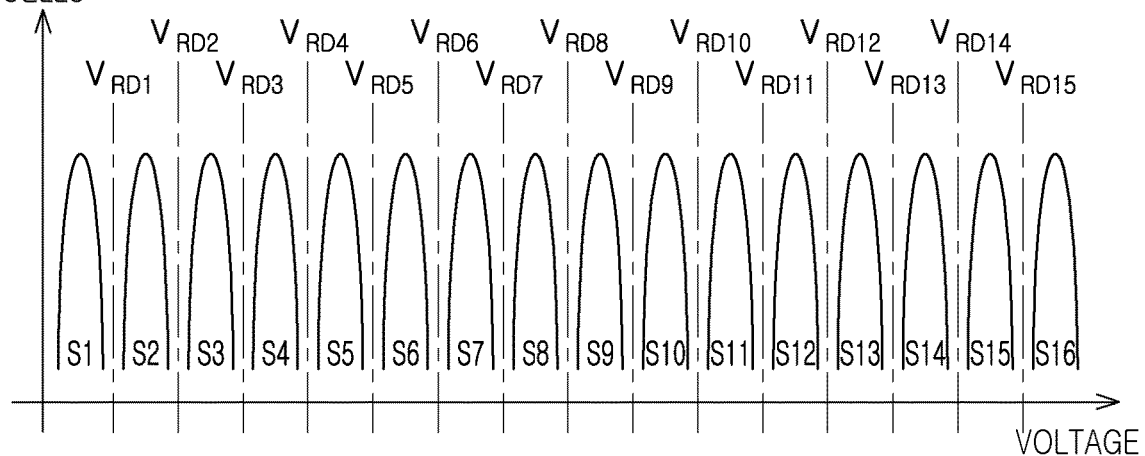

FIG. 4D illustrates a threshold voltage distribution of memory cells in a memory device in which 4 bits of data may be stored in each of the memory cells. In the example embodiment illustrated in FIG. 4D, the memory cells may have any one of first to sixteenth states S1 to S16. The memory controller may perform a reading operation by inputting first to fifteenth read voltages $V_{RD1}$ to $V_{RD15}$ between the first to sixteenth states S1 to S16 to word lines.

Referring to FIGS. 4A to 4D, as the number of bits of data stored in each of the memory cells is increased, the threshold voltage distribution may be narrowed. Therefore, if the read voltage of a correct magnitude is not input to word lines, data of memory cells may be read incorrectly. In addition, the threshold voltage distribution of the memory cells may also vary depending on characteristics of memory cells that vary depending on operating conditions and/or the number of times of use of the memory device. Therefore, to improve the operating performance of the memory device, the read voltage may be determined in consideration of the variation of the threshold voltage distribution of the memory cells.

In an example, the memory controller may include a hardware accelerator that adjusts the read voltage in consideration of characteristics and performance of the memory device or the like. However, the hardware accelerator may not be applied to a new memory device when the characteristics and performance of the memory device change due to replacement of the memory device.

In an example embodiment, a plurality of unit circuits that perform predetermined operations and/or functions may be implemented at a hardware level and mounted in a memory controller. The memory controller may determine at least portions of the unit circuits as selection unit circuits, and may generate a control command that specifies an operation order of the selection unit circuits. Depending on the control command generated by the memory controller, the type of accelerator implemented as unit circuits may be changed. Therefore, the memory controller may provide an accelerator suitable for characteristics and performance of the memory device.

The accelerator provided by the memory controller according to an example embodiment may be implemented as a combination of unit circuits, and thus, may support not only a reading operation but also various other operations. As an example, various functions requested by a host to which a storage device is connected may be implemented as a combination of unit circuits by the memory controller, thereby effectively improving operating performance of the storage device.

Figure 5:
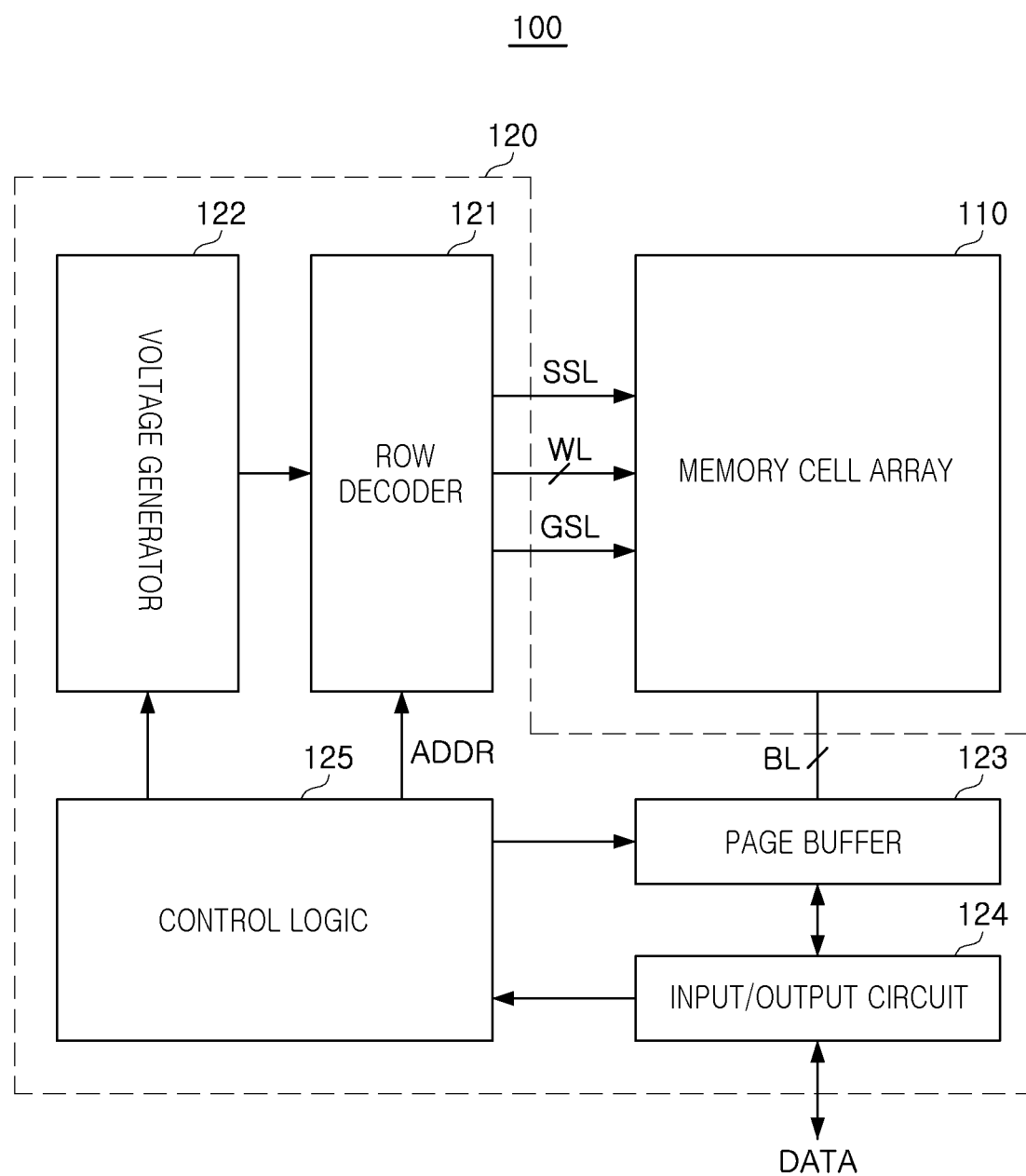
FIG. 5 is a block diagram schematically illustrating a memory device included in a storage device according to an example embodiment.

FIG. 5 is a block diagram schematically illustrating a memory device included in a storage device according to an example embodiment.

Referring to FIG. 5, a memory device 100 may include a memory cell array 110 and a peripheral circuit 120. The peripheral circuit 120 may include a row decoder 121, a voltage generator 122, a page buffer 123, an input/output circuit 124, a control logic 125, and the like.

The memory cell array 110 may include a plurality of memory cells, and the memory cell array 110 may be divided into a plurality of memory blocks. The plurality of memory cells may be connected to a row decoder 121 through a string select line SSL, word lines WL and a ground select line GSL, and may be connected to the page buffer 123 through bit lines BL. In example embodiments, a plurality of memory cells arranged in the same row may be connected to the same word line WL, and a plurality of memory cells arranged in the same column may be connected to the same bit line BL.

The row decoder 121 may decode address data ADDR input thereto to generate and transmit driving signals of the word line WL. The row decoder 121 may input a word line voltage generated by the voltage generator 122 under the control of the control logic 125 to the word lines WL.

The page buffer 123 is connected to the memory cell array 110 through the bit lines BL, and may read information stored in the memory cells or write data to the memory cells. The page buffer 123 may include a column decoder and a sense amplifier. The column decoder may select at least a portion of the bit lines BL of the memory cell array 110, and the sense amplifier may read data of a memory cell connected to the bit line selected by the column decoder during a reading operation.

The input/output circuit 124 may receive data DATA during a programming operation and transfer the data DATA to the page buffer 123. In a reading operation, the input/output circuit 124 outputs, the data DATA read from the memory cell array 110 by the page buffer 123, externally. The input/output circuit 124 may transfer an address or a command received from an external memory controller to the control logic 125.

The control logic 125 may control operations of the row decoder 121, the voltage generator 122, the page buffer 123, and the like. In an example embodiment, the control logic 125 may operate depending on a control signal and an external voltage transmitted from an external memory controller or the like.

The voltage generator 122 may generate control voltages required for the operation of the memory device 100, for example, a program voltage, a read voltage, an erasing voltage and a pass voltage, by using an externally input power voltage. The voltage generated by the voltage generator 122 may be supplied to the peripheral circuit 120 or may be input to the memory cell array 110 through the row decoder 121 or the like.

As an example, a program voltage may be input to a selected word line connected to a selected memory cell to which data is to be written in a programming operation. A pass voltage lower than the program voltage may be input to unselected word lines connected to unselected memory cells that are included in one memory cell string and share a channel region with the selected memory cell.

In an example embodiment, in a reading operation, a read voltage is input to a selected word line connected to a selected memory cell from which data is to be read, and a pass voltage may be input to unselected word lines connected to unselected memory cells that share a channel region with the selected memory cell. In an example embodiment in which each of the memory cells stores data having a plurality of bits, the row decoder 121 may input a plurality of read voltages having different magnitudes to the selected word line.

As described above, data written in the memory cells may be distinguished depending on threshold voltages of the memory cells. Threshold voltages of the memory cells may vary depending on characteristics of the memory cells, and characteristics of the memory cells may vary depending on the number of times of use of the memory device 100, the location of the memory cells in the memory cell array 110, or the like. Therefore, a control voltage input to the memory cell array 110 by the row decoder 121 can be adjusted based on the number of times of use of the memory device 100, the location of the memory cells or the like, during a control operation such as a programming operation, a reading operation and the like.

In general, a hardware accelerator provided in consideration of the characteristics of the memory device 100, for example, the number of stacked word lines WL, the number of memory cells included in one memory block, and respective thicknesses of the word lines WL determining a gate length of the memory cells, and the like, may be mounted in the memory controller control the memory device 100. However, the hardware accelerator may not be applied to a memory device having characteristics different from those of the memory device 100, and as a result, a problem of newly designing a memory controller for each memory device 100 may occur.

In an example embodiment, the memory controller may include a core block and an operation block, and the operation block may include a plurality of unit circuits executing a predetermined operation and/or function. For example, the unit circuits may perform different functions and/or operations, and may perform a shift operation, a minimum value algorithm, a maximum value algorithm, a minus operation, a plus operation, data retrieval, a data write, and the like. When the core block sends a control command to the operation block, the operation block may process the task indicated by the control command and return a completion command to the core block.

In an example embodiment, the control command may specify selection unit circuits which are at least portions of the unit circuits included in the operation block and an operation order of the selection unit circuits, and the selection unit circuits operate in the order of operation, thereby processing a task indicated by the control command. As a result, according to an example embodiment, a hardware accelerator in which an operation block provides various functions depending on data included in the control command may be implemented. Thus, a memory controller universally applicable to the memory device 100 having different characteristics or operating under different operating conditions, and a storage device including the same, may be provided.

Figure 6:
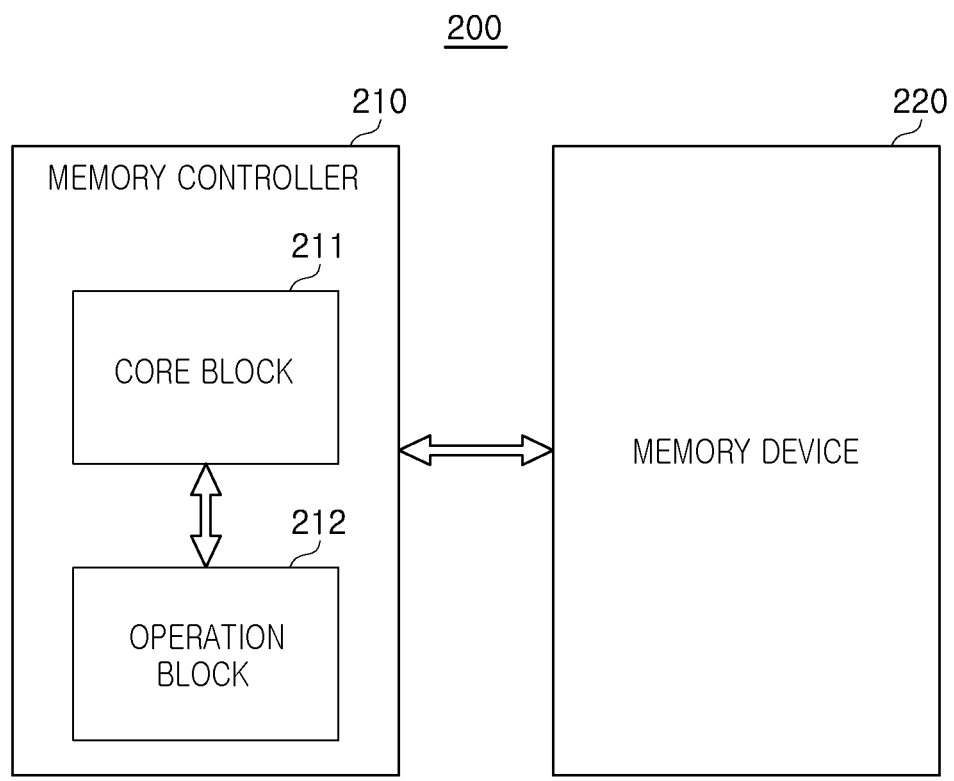
FIG. 6 is a block diagram schematically illustrating a storage device according to an example embodiment.

FIG. 6 is a block diagram schematically illustrating a storage device according to an example embodiment.

Referring to FIG. 6, a storage device 200 according to an example embodiment may include a memory controller 210 and a memory device 220. The memory device 220 may include a flash memory having nonvolatile characteristics.

The memory controller 210 may include a core block 211 and an operation block 212. The core block 211 may include a processor that controls overall operations of the storage device 200, and may control the memory device 220, based on a command transmitted from a host to which the storage device 200 is connected. For example, the core block 211 may write data received from the host to the memory device 220 or read data stored in the memory device 220 and transmit the data to the host.

The operation block 212 may include a plurality of unit circuits that execute predetermined calculations and/or functions. Each of the unit circuits included in the operation block 212 may be connected to all of the remaining unit circuits. In an example embodiment, the unit circuits may respectively operate based on code represented in hardware form available at an RTL level and a gate level. For example, the unit circuits execute different functions and/or operations that do not overlap each other, and operations such as plus operation, minus operation, maximum value operation, minimum value operation, shift operation, data retrieval, data writing and the like may be executed by the unit circuits, respectively.

The unit circuits included in the operation block 212 may operate in response to a control command transmitted by the core block 211. For example, the core block 211 may generate a control command in a SQ format and transmit the control command to the operation block 212. The control command may include a transmission order of the control command, data required for a task that should be processed by the operation block 212, selection unit circuits, an operation sequence of the selection unit circuits, and the like. The selection unit circuits may be unit circuits that actually operate in a task to be processed by the operation block 212 by a control command, among the unit circuits included in the operation block 212.

In an example embodiment, the type of task that the operation block 212 may process is not limited, and the task that the operation block 212 processes may be determined depending on the selection unit circuits included in the control command and the operation order thereof. Accordingly, an accelerator capable of processing various tasks may be provided by one operation block 212 having a plurality of unit circuits, and the performance of the storage device 200 may be improved and versatility of the memory controller 210 may be improved.

Figure 7:
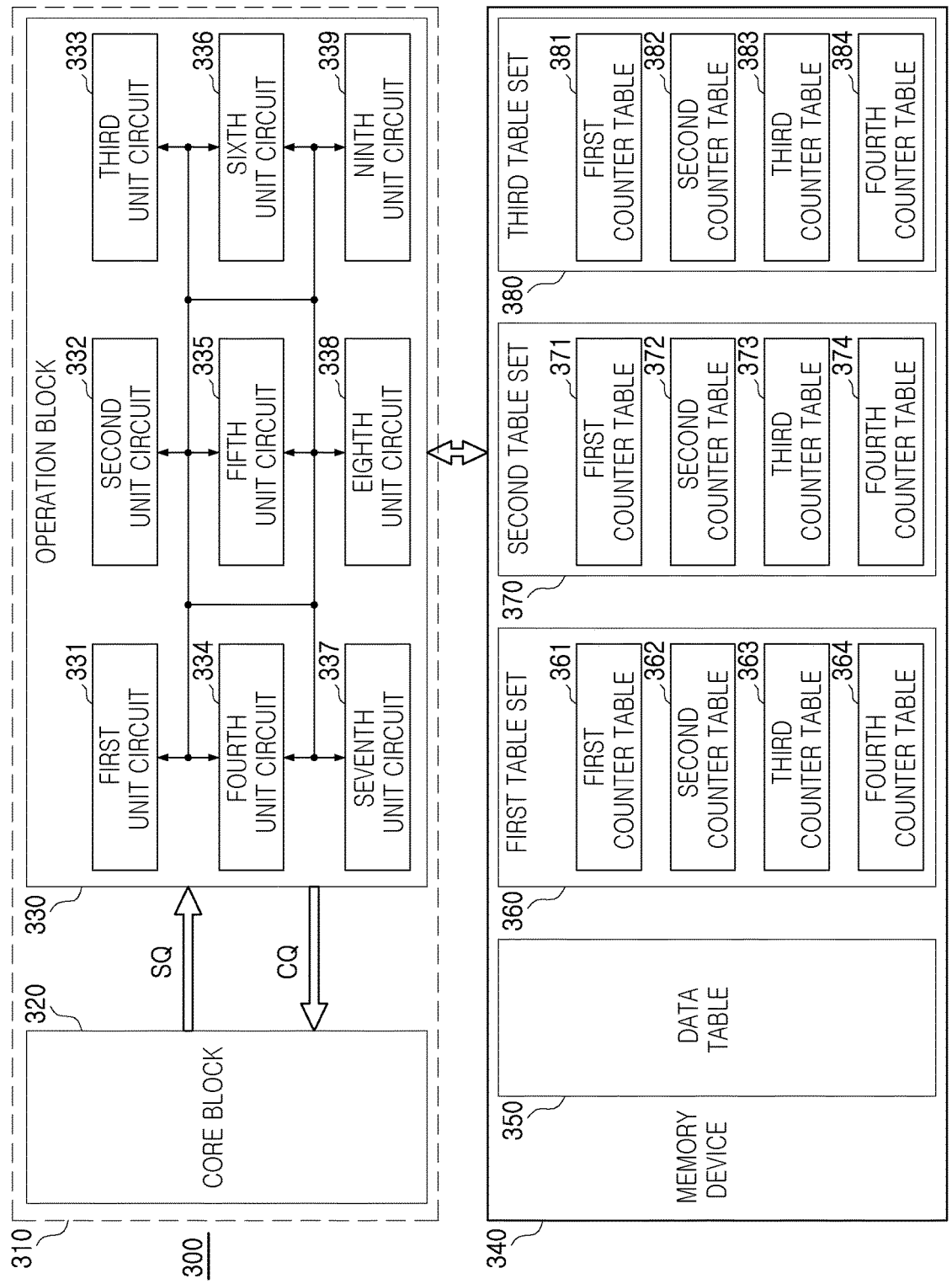
FIG. 7 is a view illustrating operations of a storage device according to an example embodiment.

FIG. 7 is a view illustrating operations of a storage device according to an example embodiment.

Referring to FIG. 7, a storage device 300 according to an example embodiment may include a memory controller 310 and a memory device 340. The memory controller 310 may include a core block 320 and an operation block 330, and the operation block 330 may include first to ninth unit circuits 331 to 339. The number of unit circuits 331 to 339 may be variously modified according to example embodiments.

The first to ninth unit circuits 331 to 339 may execute different functions and/or operations. In an example embodiment, the functions and/or operations performed by the first to ninth unit circuits 331 to 339, respectively, may not overlap each other. Each of the first to ninth unit circuits 331 to 339 may be connected to all of remaining unit circuits. Referring to FIG. 7, for example, a first unit circuit 331 may be connected to all of second to ninth unit circuits 332 to 339. Similarly, a ninth unit circuit 339 may be connected to all of the first to eighth unit circuits 331 to 338.

The core block 320 may generate a control command SQ and transmit the generated control command SQ to the operation block 330. The control command SQ may include a transmission order of a corresponding control command SQ, data that is required for the operation block 330 to execute a task indicated by the control command SQ, selection unit circuits required for executing the task indicated by the control command SQ, an operation sequence thereof, and the like.

When the selection unit circuits complete the task indicated by the control command SQ, the operation block 330 may transmit a completion command CQ to the core block 320. The completion command CQ may have a completion queue (CQ) format. In an example embodiment, the completion command CQ may include data such as at least one of control commands SQ transmitted by the core block 320.

The memory device 340 may include a data table 350 and a plurality of table sets 360 to 380. For example, in the data table 350, data required for control the memory device 340, for example, control voltages input to word lines or bit lines of the memory device 340 may be stored. Data stored in the data table 350 may be changed by a unit circuit capable of recording data among the firth to ninth unit circuits 331 to 339.

In an example embodiment, each of the memory cells included in the memory device 340 may store data having a plurality of bits. For example, in the memory device 340 in which each of the memory cells stores 4 bits of data therein, the memory controller 320 may read data from a selected memory cell using a plurality of read voltages. Depending on the data stored in the memory cells, threshold voltages of the memory cells may have a distribution, and the threshold voltage distribution of the memory cells may vary, depending on operating conditions, the number of times of use, and the like.

In an example embodiment, the memory controller 320 initially adjusts set read voltages and reads data from the memory cell in response to a change in the threshold voltage distribution. For example, in the data table 350, read voltages adjusted by the memory controller 320 in consideration of the change in the threshold voltage distribution with respect to the memory cells may be stored. In addition to the read voltage, a pass voltage, a program voltage and the like may be stored in the data table 350, and voltages input to bit lines in a data reading operation or a data programming operation may be stored.

In an example embodiment, in the plurality of respective table sets 360 to 380, control voltages depending on the number of times of use of the memory device 340 may be stored. For example, in a first counter table 361 of a first table set 360, control voltages of the memory cells may be stored when the number of times of use of the memory device 340 is less than or equal to a first reference number. In a second counter table 362, control voltages of the memory cells may be stored when the number of times of use of the memory device 340 is greater than the first reference number and less than or equal to a second reference number. In a third counter table 363, control voltages of the memory cells may be stored when the number of times of use of the memory device 340 is greater than the second reference number and less than or equal to a third reference number. In a fourth counter table 364, control voltages of the memory cells may be stored when the number of times of use of the memory device 340 is greater than the third reference number and less than or equal to a fourth reference number.

In the respective first to third table sets 360 to 380, the same type of control voltages may be classified and stored depending on the number of times of use of the memory device 340, and control voltages stored in each of the first to third table sets 360 to 380 may be different from each other. For example, the control voltages stored in each of the first to third table sets 360 to 380 are read voltages input to selected word lines in a reading operation, program voltages input to selected word lines in a programming operation, a pass voltage input to unselected word lines in a reading operation or a programming operation, or the like.

The operation block 330 may execute a task indicated by the control command SQ using data stored in the data table 350 and the first to third table sets 360 to 380, depending on the type of the control command SQ received from the core block 320. One of the first to ninth unit circuits 331 to 339 may execute a data retrieval function of reading data from the first to third table sets 360 to 380. In addition, one of the first to ninth unit circuits 331 to 339 may execute a data writing function of changing data stored in the data table 350.

For example, FIG. 7 includes second table set 370, which includes first counter table 371, second counter table 372, third counter table 373 and fourth counter table 374. FIG. 7 also includes third table set 380, which includes first counter table 381, second counter table 382, third counter table 383 and fourth counter table 384.

FIGS. 8A and 8B are diagrams illustrating commands generated in a memory controller according to an example embodiment.

First, FIG. 8A illustrates a control command transmitted from a core block of a memory controller to an operation block. In an example embodiment illustrated in FIG. 8A, the control command may include a first command SQ0 and a second command SQ1 transmitted sequentially.

The first command SQ0 may include a sequence identifier QID indicating a transmission order of a control command, and first data DATA0 and a second data field DATA1 in which data required for executing a task indicated by the control command by the operation block are recorded. The configuration of the first command SQ0 may vary according to various embodiments.

The second command SQ1 may include selection unit circuits that are required for the operation block to execute a task indicated by the control command, and an operation sequence thereof. In the example embodiment illustrated in FIG. 8A, it is assumed that the selection unit circuits are stored in eight fields, but the number of the selection unit circuits may increase or decrease depending on a task indicated by the control command.

FIG. 8B illustrates a completion command CQ0 transmitted to the core block by the operation block having completed the operation indicated by the control command. The completion command CQ0 may be the same as a portion of the control command transmitted by the core block to the operation block. As an example, in the example embodiment illustrated in FIG. 8B, the completion command CQ0 may be the same as the first command SQ0. The core block may determine whether the task, indicated by a control command sent in which order, has been completed, by referring to a transmission order recorded in the sequence identifier QID of the completion command CQ0.

FIGS. 9 to 17 are diagrams illustrating operations of a storage device according to an example embodiment.

FIG. 9 illustrates a control command transmitted from a core block to an operation block in a memory controller of a storage device according to an example embodiment. The control command may include a first command SQ0 and a second command SQ1, which are continuously transmitted.

The first command SQ0 may include a first field QID indicating a transmission order of the control command. When the operation block completes the task indicated by the control command and returns a completion command to the core block, the operation block may write a value of the sequence identifier QID included in the first command SQ0 to a completion command as it is and may transmit the value to the core block. In the example embodiment illustrated in FIG. 9, the first command SQ0 may be a control command that the core block first sends to the operation block.

The first command SQ0 may include first data DATA0 and second data DATA1 which are required for the operation block to execute a task indicated by the control command. In the example embodiment illustrated in FIG. 9, the first data DATA0 may correspond to the number of times of use of the memory device. The second data DATA1 may correspond to initial values INIT1 to INIT15 of control voltages input to a selected word line connected to a selected memory cell by the memory controller when the memory controller performs a control operation on the memory device. In the example embodiment illustrated in FIG. 9, the number of times of use of the memory device indicated by the first data DATA0 may be 0.8 k, and the second data DATA1 may be initial values INIT1 to INIT15 of read voltages required for a reading operation. The memory controller generating the control command according to the example embodiment illustrated in FIG. 9 may control a memory device in which 4 bits of data are stored in one memory cell.

The operation block receiving the control command from the core block may include a plurality of unit circuits executing a predetermined function and/or operation. The second command SQ1 may store selection unit circuits required for completing a task of adjusting a read voltage in consideration of the number of times of use of the memory device, and the operation order thereof. In the example embodiment illustrated in FIG. 9, a fifth unit circuit F5, a fourth unit circuit F4, a first unit circuit F1, a second unit circuit F2, and a sixth unit circuit F6 operate in order, to adjust the read voltage. Hereinafter, the operation of the selection unit circuits according to an example embodiment will be described in more detail with reference to FIGS. 10 to 17.

Figure 10:
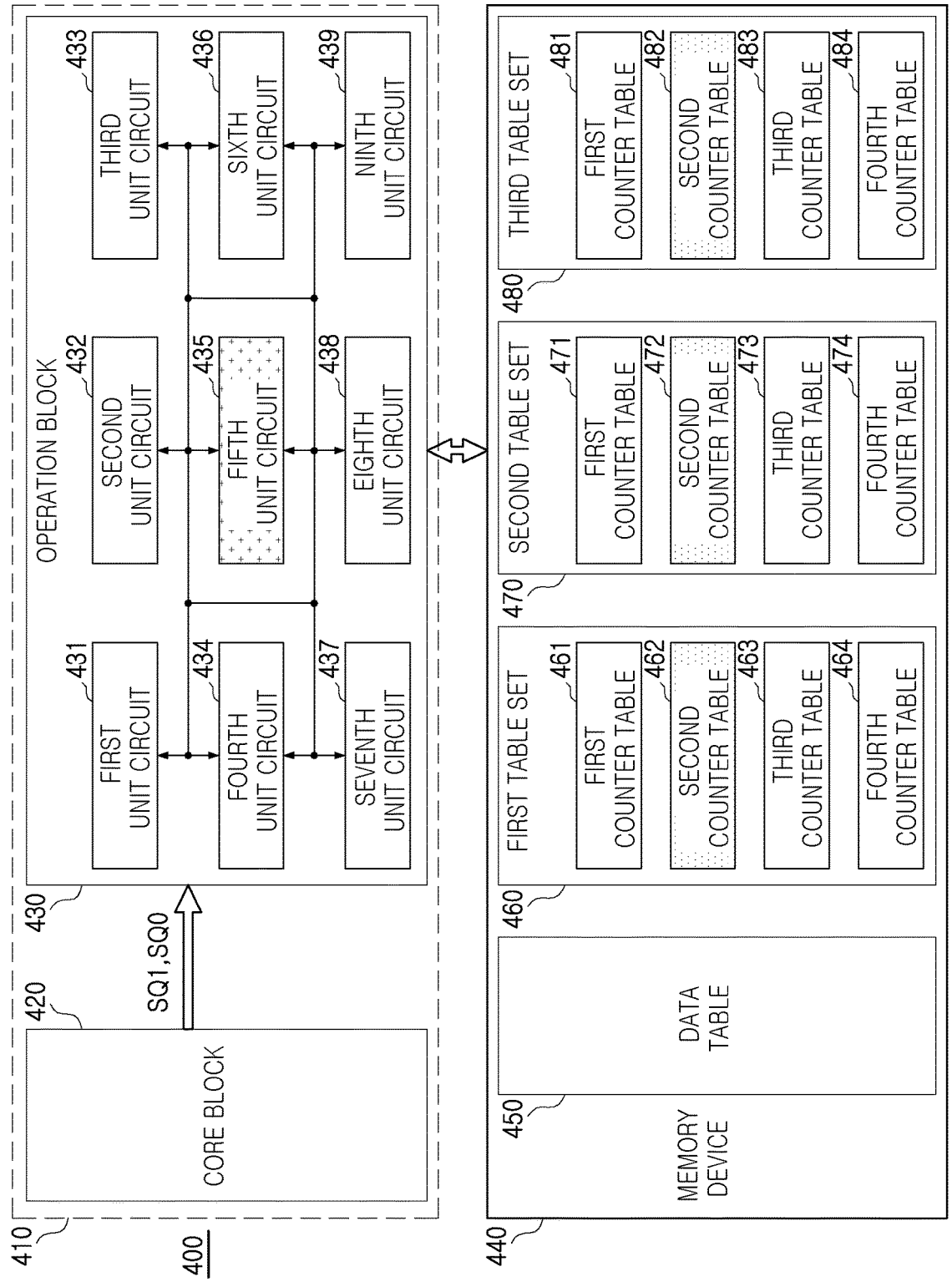
Figure 11:
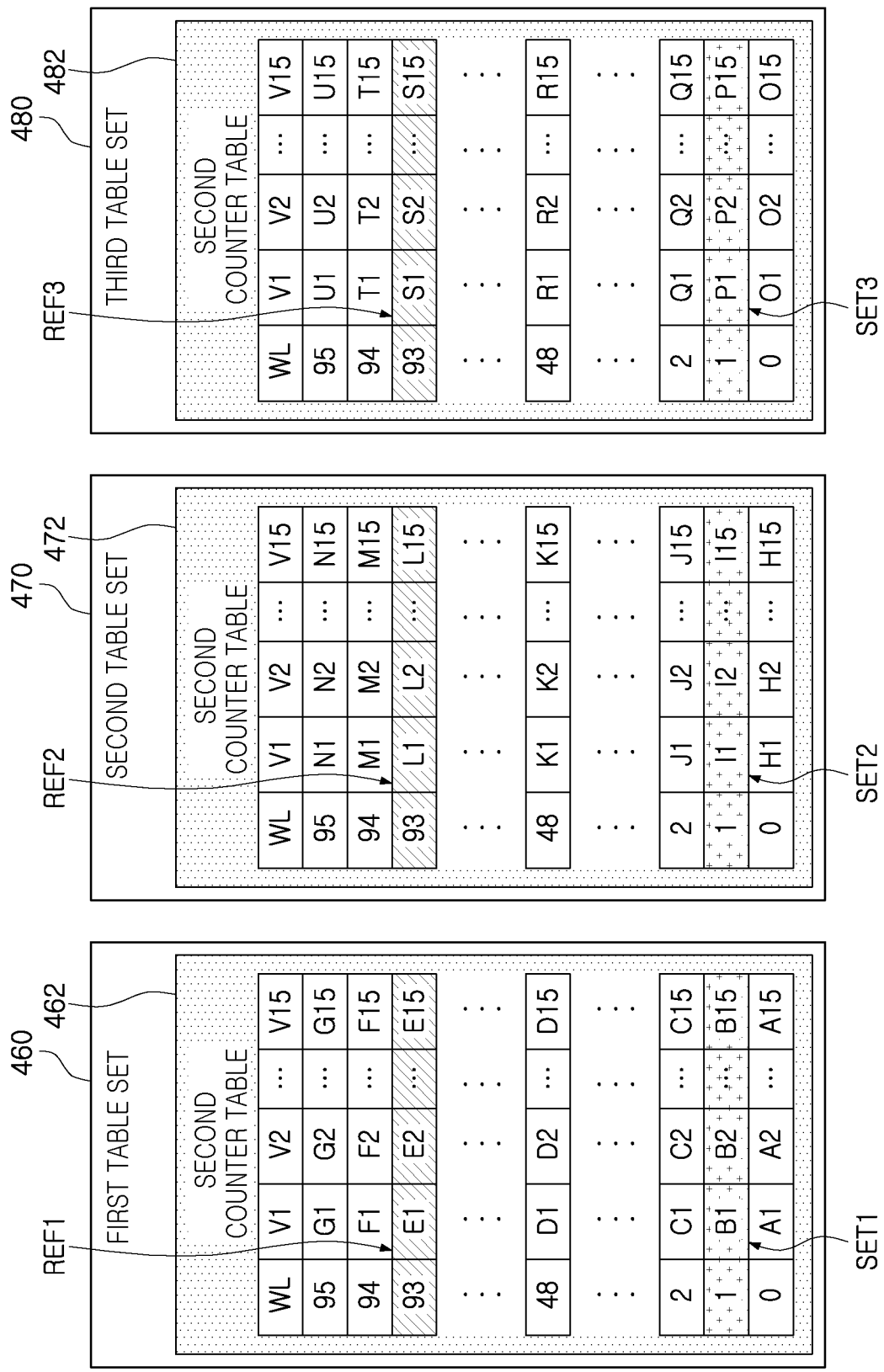

FIGS. 10 and 11 are diagrams illustrating operations of the fifth unit circuit F5 that operates first among the selection unit circuits. First, referring to FIG. 10, a storage device 400 according to an example embodiment may include a memory controller 410 and a memory device 440. The memory controller 410 may include a core block 420 and an operation block 430, and the operation block 430 may include first to ninth unit circuits 431 to 439. The operation block 430 sequentially receives a first command SQ0 and a second command SQ1 from the core block 420, and may determine selection unit circuits 431, 432, 434, 435 and 436 among the first to ninth unit circuits 431 to 439 by referring to the second command SQL In addition, as stored in the second command SQ1, the fifth unit circuit 435 may operate first.

FIG. 10 includes first table set 460 which includes first counter table 461, second counter table 462, third counter table 463 and fourth counter table 464. FIG. 10 also includes second table set 470 which includes first counter table 471, second counter table 472, third counter table 473 and fourth counter table 474. FIG. 10 also includes third table set 480 which includes first counter table 481, second counter table 482, third counter table 483 and fourth counter table 484.

In an example embodiment, the fifth unit circuit 435 may execute a data retrieval function. The fifth unit circuit 435 may refer to first data DATA0 included in the first command SQ0 to select a counter table corresponding to 0.8 k, the number of times of use of the memory device, from each of first to third table sets 460 to 480. For example, the fifth unit circuit 435 may select second counter tables 462, 472 and 482 from the first to third table sets 460 to 480, respectively.

Referring to FIG. 11, in the second counter tables 462, 472 and 482 selected from the plurality of table sets 460 to 480, respectively, prediction values of control voltages V1 to V15 depending on the number of times of use of the memory device 440 may be stored. For example, the prediction values of the control voltages V1 to V15 in the second counter tables 462, 472 and 482 may vary, depending on word lines connected to the memory cells. The control voltages V1 to V15 may be read voltages input to the selected word lines in a reading operation.

The fifth unit circuit 435 may read, prediction values B1 to B15, I1 to I15, and P1 to P15 of control voltages V1 to V15 corresponding to a target word line WL1 of which the read voltage is to be adjusted, from the second counter tables 462, 472 and 482. The fifth unit circuit 435 may read reference values E1 to E15, L1 to L15, and S1 to S15, of the control voltages V1 to V15 assigned to a preset reference word line WL93, in the second counter tables 462, 472 and 482. For example, the prediction values may include a first set SET1, a second set SET2 and a third set SET3, and the reference values may include a first reference set REF1, a second reference set REF2 and a third reference set REF3.

Figure 12:
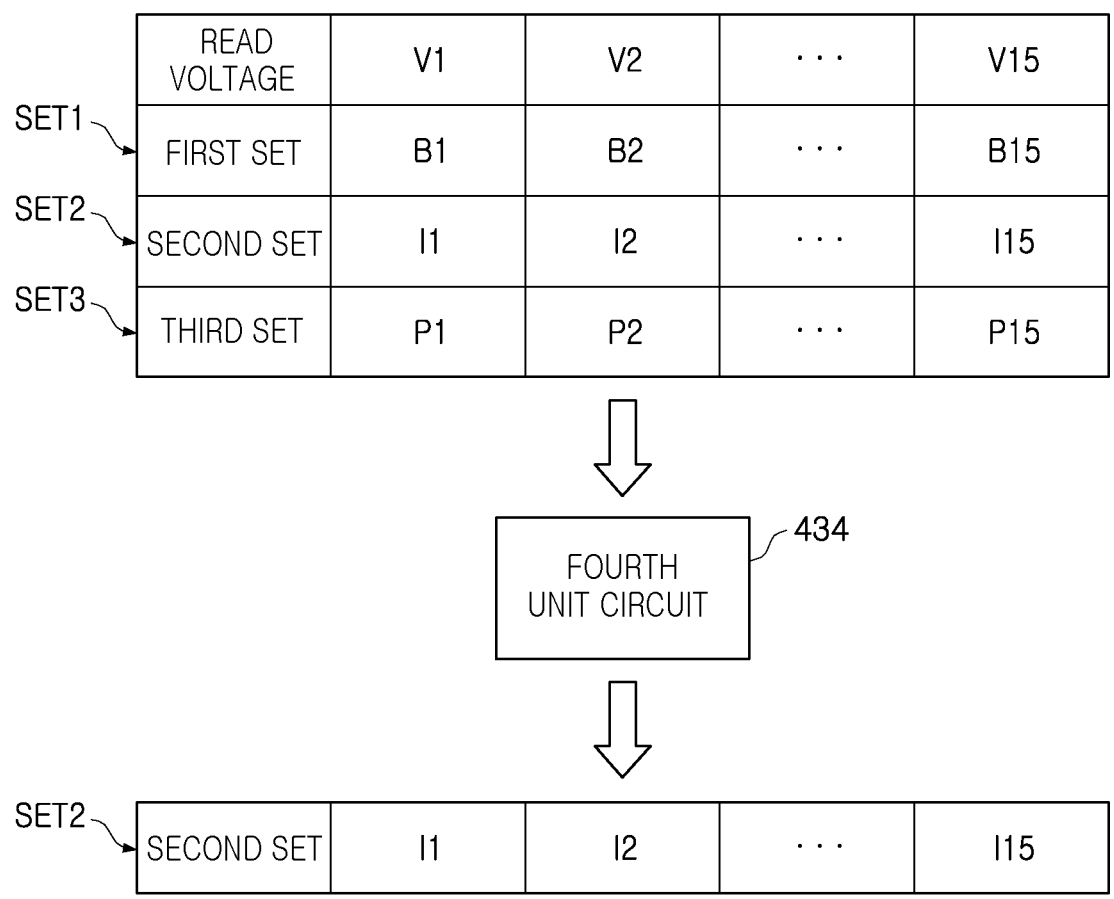

FIG. 12 is a diagram illustrating an operation of the fourth unit circuit 434 which operates subsequently to the fifth unit circuit 435. In an example embodiment, the fourth unit circuit 434 may be a unit circuit that executes a minimum value algorithm. The fourth unit circuit 434 may receive the first set SET1, the second set SET2 and the third set SET3 from the fifth unit circuit 435, and may select one set by applying a minimum value algorithm. In the example embodiment illustrated in FIG. 12, the fourth unit circuit 434 may select the second set SET2.

Figure 13:
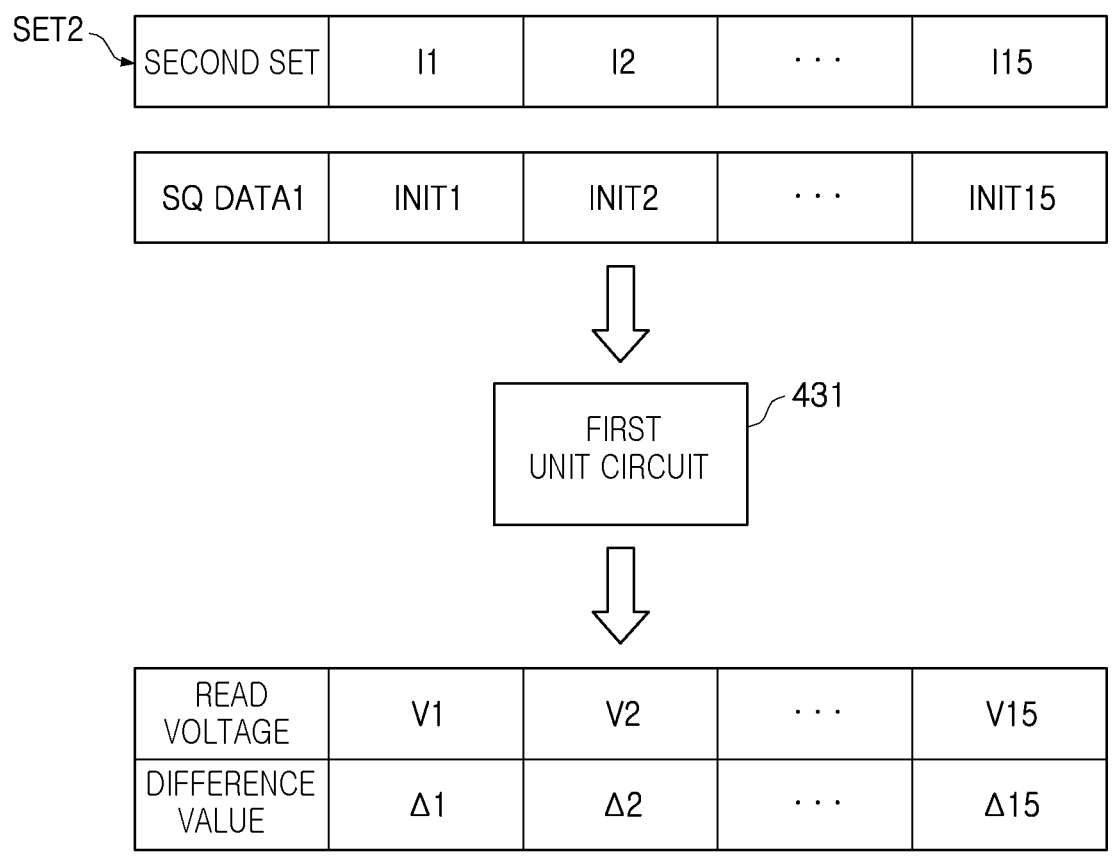

FIG. 13 is a diagram illustrating an operation of the first unit circuit 431 that operates subsequently to the fourth unit circuit 434. In an example embodiment, the first unit circuit 431 may be a unit circuit that performs a minus operation. The first unit circuit 431 may receive the second set SET2 from the fourth unit circuit 434, and the initial values INIT1 to INIT15 of the read voltages included in the first command SQ0. The first unit circuit 431 may calculate difference values Δ1 to Δ15 between the prediction values I1 to I15 of the read voltages included in the second set SET2 and the initial values INIT1 to INIT15 of the read voltages.

Figure 14:
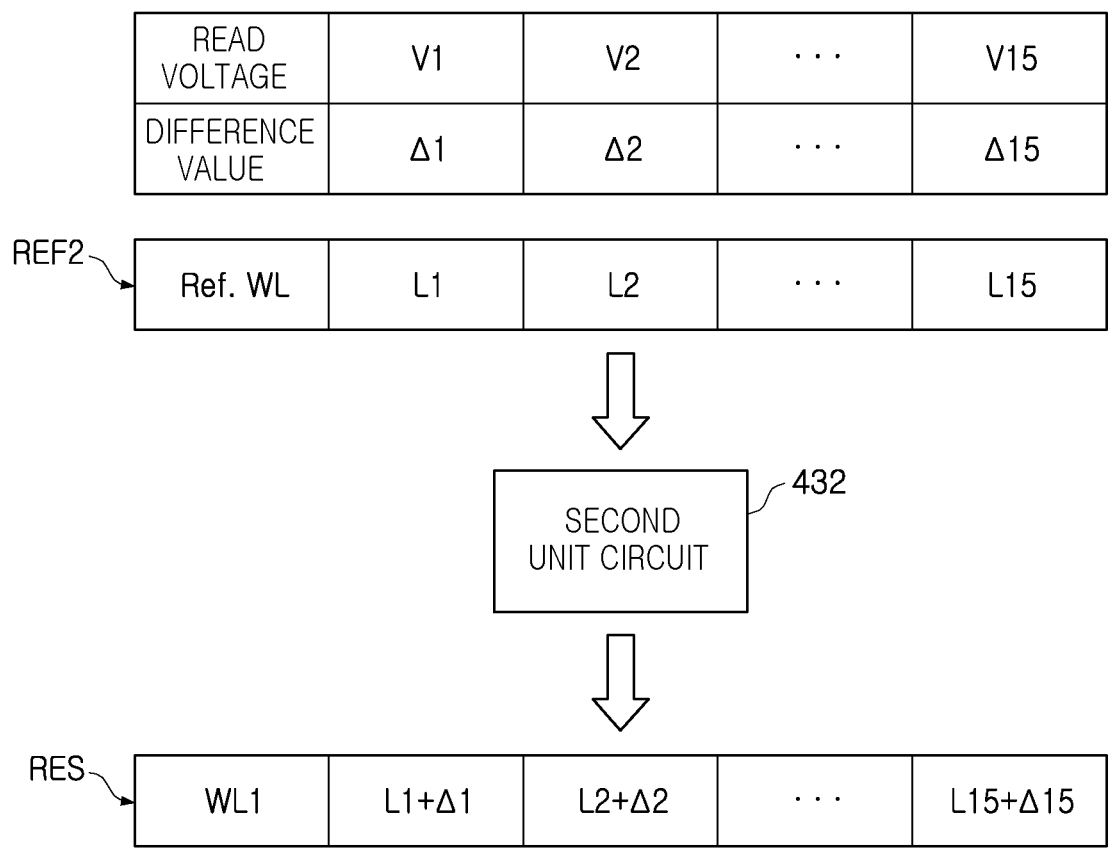

FIG. 14 is a diagram illustrating an operation of the second unit circuit 432 that operates subsequently to the first unit circuit 431. In an example embodiment, the second unit circuit 432 may be a unit circuit that performs a plus operation. The second unit circuit 432 may receive the difference values Δ1 to Δ15 of the read voltages from the first unit circuit 431. Also, the second unit circuit 432 may receive the second reference set REF2 included in the second counter table 472, such as the second set SET2 selected by the fourth unit circuit 434.

According to an example embodiment, the second unit circuit 432 may acquire set values L1+Δ1 to L15+Δ15 of the read voltages, by adding difference values Δ1 to Δ15 between the read voltages, calculated by the first unit circuit 431, to the reference values L1 to L15 of the read voltages included in the second reference set REF2, respectively. The operation result of the second unit circuit 432 may be defined as a result set RES for the read voltage.

Figure 15:
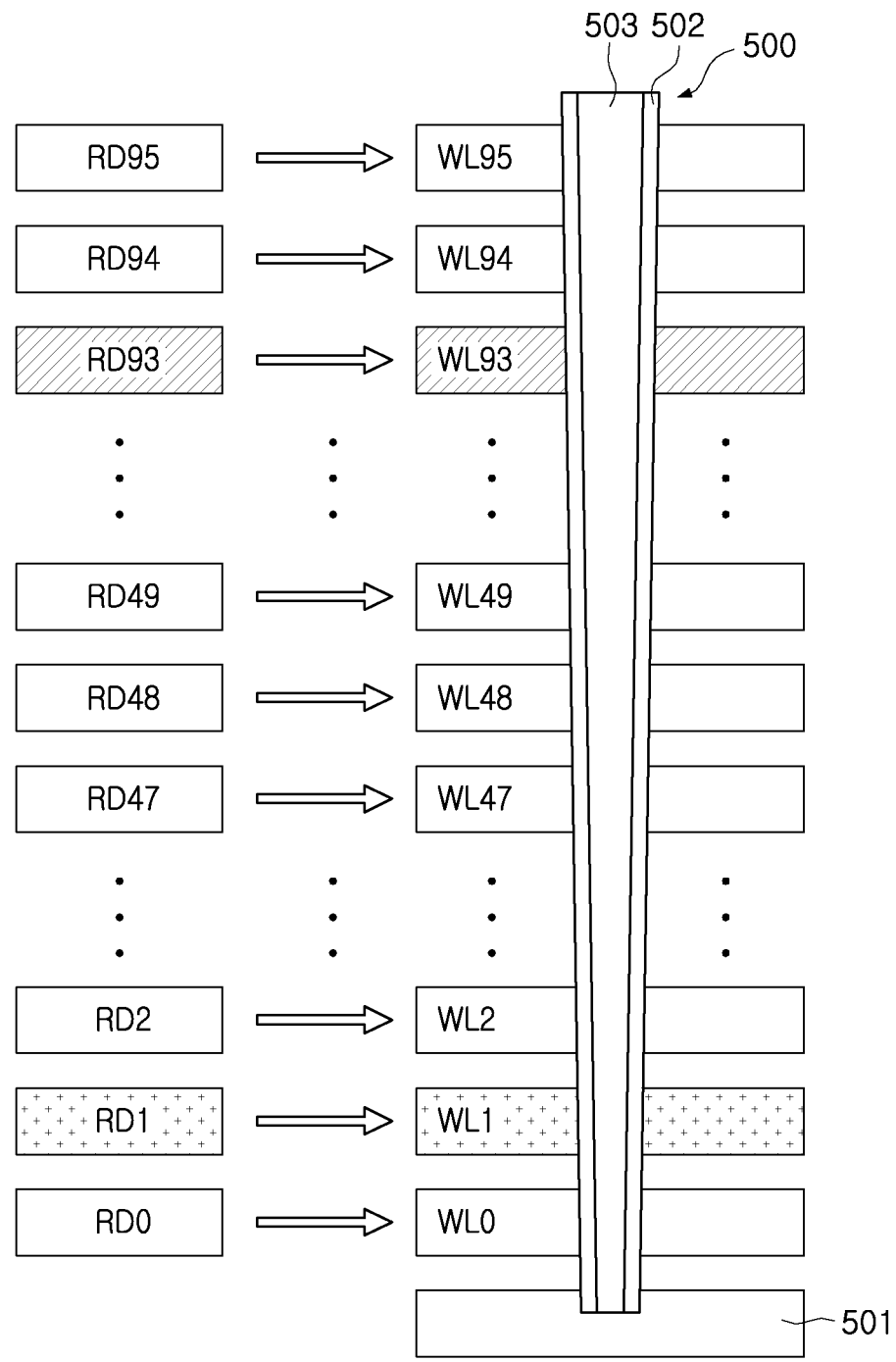

Referring to FIG. 15, a memory device 500 may include a plurality of word lines WL0 to WL95 stacked on a substrate 501, a charge storage layer 502 and a channel region 503 disposed perpendicularly to an upper surface of the substrate 501, while penetrating through the plurality of word lines WL0 to WL95, and the like. Read voltage sets RD0 to RD95 may be allocated to the word lines WL0 to WL95, respectively, and each of the read voltage sets RD0 to RD95 includes a plurality of read voltages for distinguishing 4-bit data.

In the example embodiment described with reference to FIGS. 9 to 14, the result set RES of the read voltage calculated by the operation block 430 is a read voltage set RD1 for the target word line WL1, and may be stored in the data table 450 of the memory device 440. As described with reference to FIGS. 9 to 14, the read voltage set RD1 for the target word line WL1 may be determined by the initial values INIT1 to INIT15 included in the first command SQ0, and the prediction values I1 to I15 and the reference values L1 to L15 stored in the second counter table 472 selected by the operation block 430. The reference values L1 to L15 may be values of the read voltages included in the read voltage set RD93 allocated to the preset reference word line WL93.

Figure 16:
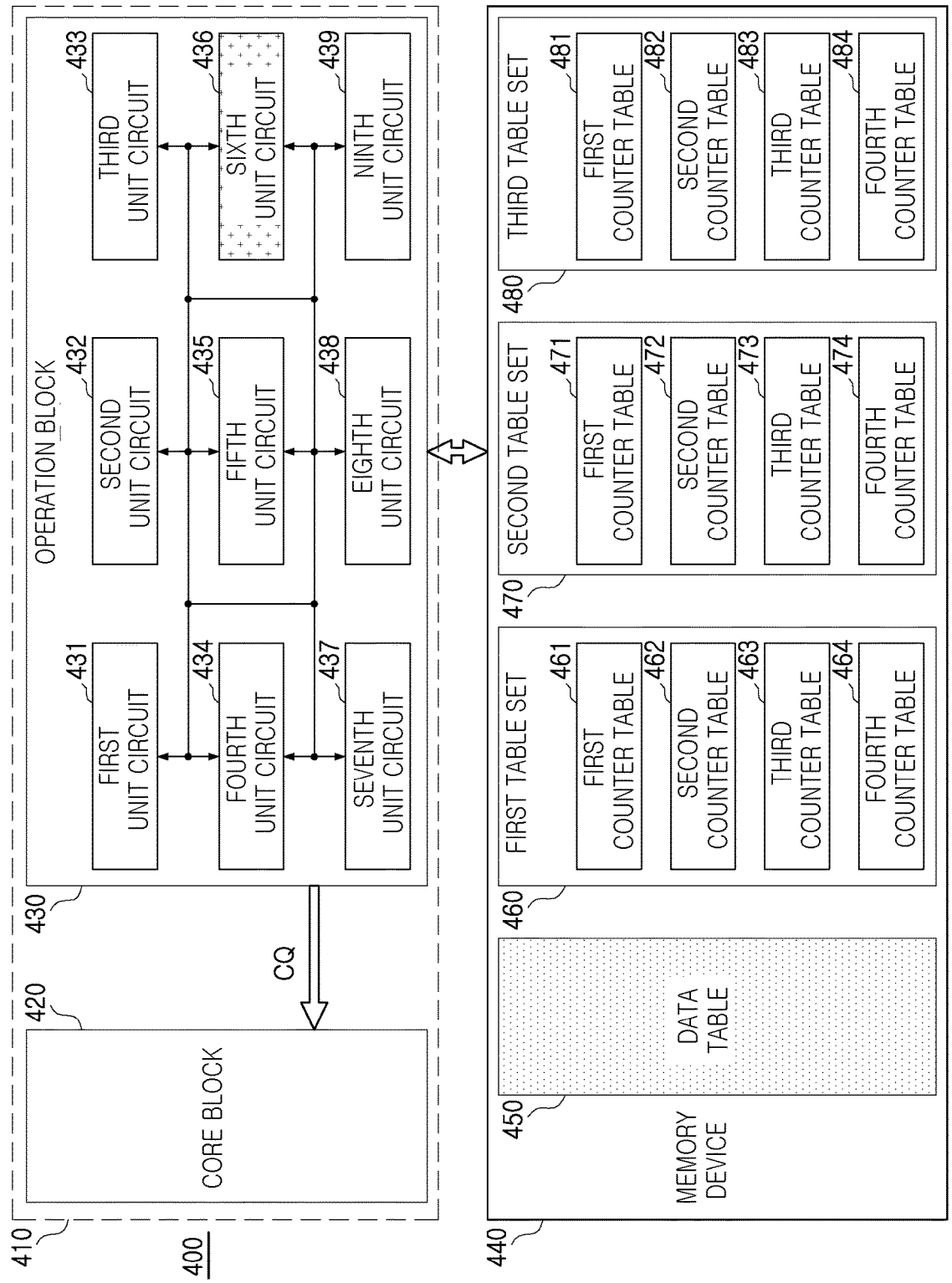

FIG. 16 is a diagram illustrating an operation of the sixth unit circuit 436 which operates subsequently to the second unit circuit 432. In an example embodiment, the sixth unit circuit 436 may be a unit circuit that executes a data writing function. The sixth unit circuit 436 may write the result set RES of the read voltage output by the second unit circuit 432 to the data table 450 of the memory device 440. Accordingly, the read voltage adjustment for the target word line WL1 may be completed, and the read voltages for reading data from the memory cells connected to the target word line WL1 may be selected as the result values RES written in the data table 450.

Figures 17, 18:
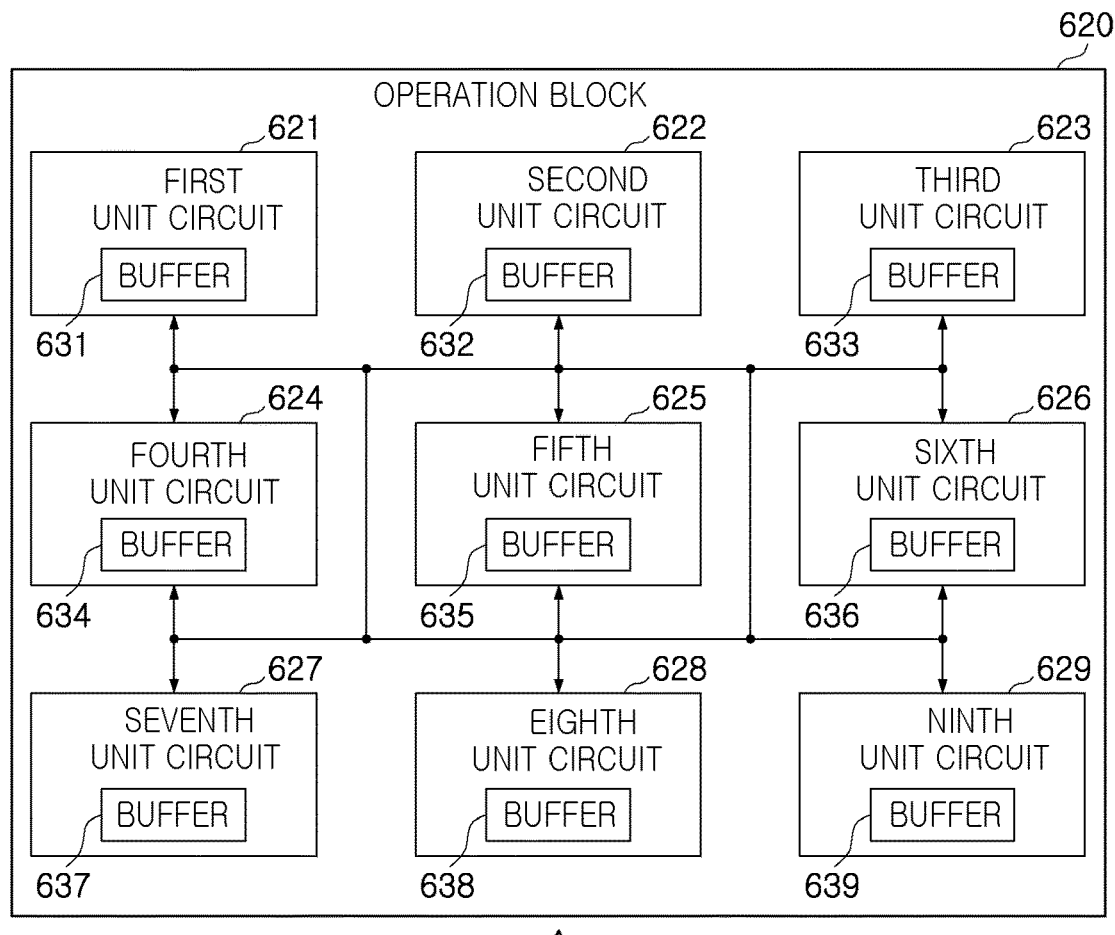

When the sixth unit circuit writes the result set RES of the read voltage in the data table 450, the operation block 430 may output the completion command CQ to the core block 420. As illustrated in FIG. 17, the completion command CQ may include data such as the first command SQ0 transmitted to the operation block 430 by the core block 420. The core block 420 may confirm that the adjustment of the read voltage for the target word line WL1 requested to the operation block 430 has been completed by referring to the sequence identifier QID included in the completion command CQ.

In the example embodiment described with reference to FIGS. 9 to 17, although it is assumed that the operation block 430 adjusts the read voltage in response to the control command transmitted by the core block 420, the operation block 430 may execute various tasks in addition thereto. The operation block 430 includes unit circuits 431 to 439 executing a predetermined function and/or operation, and selection unit circuits that actually operate among the unit circuits 431 to 439, and the operation order thereof, may be determined by the control command transmitted by the core block 420.

Accordingly, depending on a control command transmitted from the core block 420, the operation block 430 may adjust various control voltages input to word lines and bit lines in the operation of the memory device 440. In addition, not only the level of the control voltages, but also the input timing of the control voltages may be adjusted by the combination of the unit circuits 431 to 439. For example, in an example embodiment, accelerators that provide various functions may be implemented as a single operation block 430 by combining the unit circuits 431 to 439 in different manners.

FIGS. 18 to 21 are drawings illustrating an operation of a memory controller included in a storage device according to an example embodiment.

In an example embodiment described with reference to FIGS. 18 to 21, a memory controller 600 may include a core block 610 and an operation block 620. The operation block 620 may include first to ninth unit circuits 621 to 629. The number of unit circuits 621 to 629 included in the operation block 620 may be variously changed according to example embodiments, and each of the unit circuits 621 to 629 may be connected to all of the remaining unit circuits.

Referring to FIG. 18, the firth to ninth unit circuits 621 to 629 may include buffers 631 to 639. Since the first to ninth unit circuits 621 to 629 include the buffers 631 to 639, control commands sequentially transmitted by the core block 610 may be simultaneously processed in parallel with the first to ninth unit circuits 621 to 629.

Figure 19:
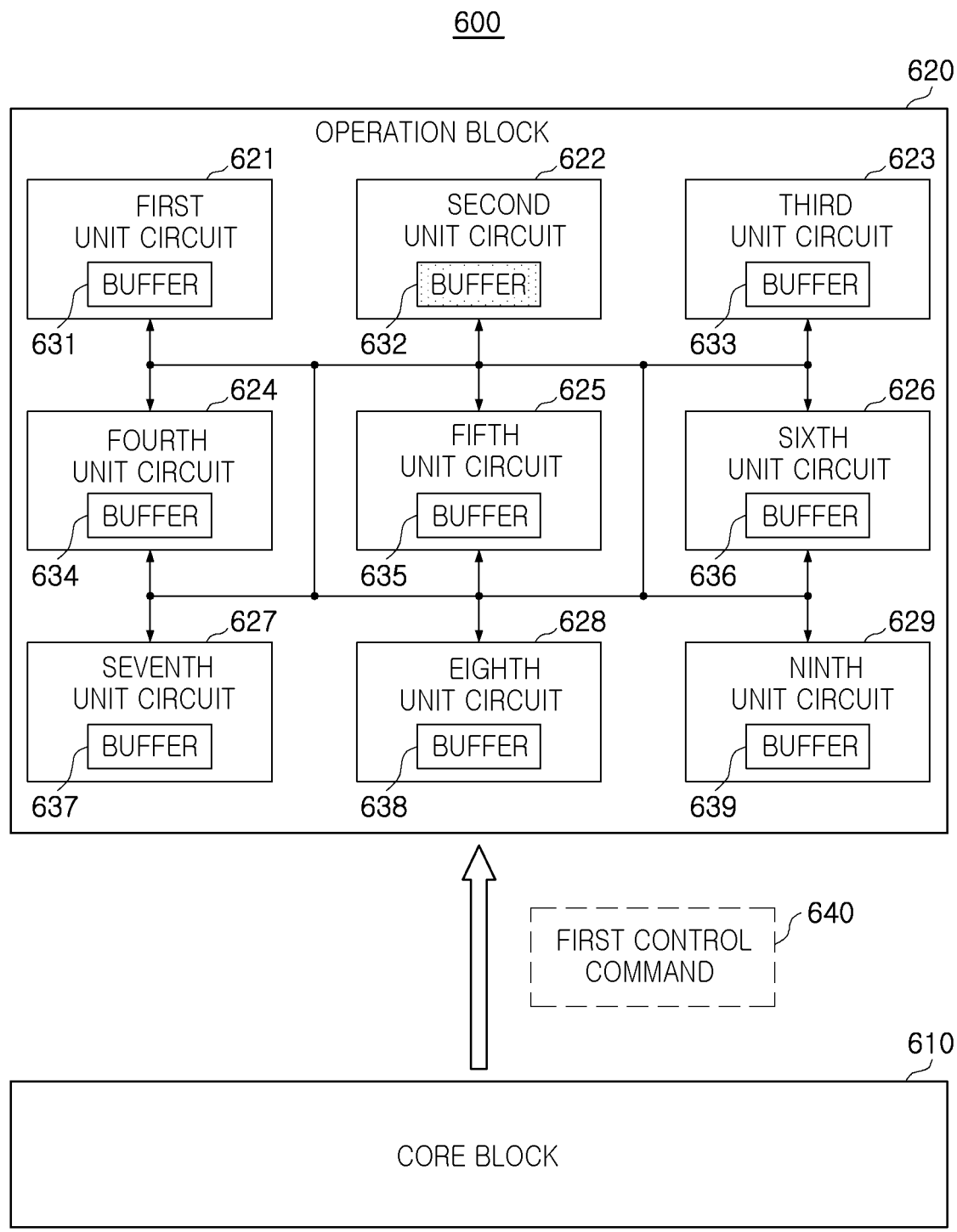
Figure 20:
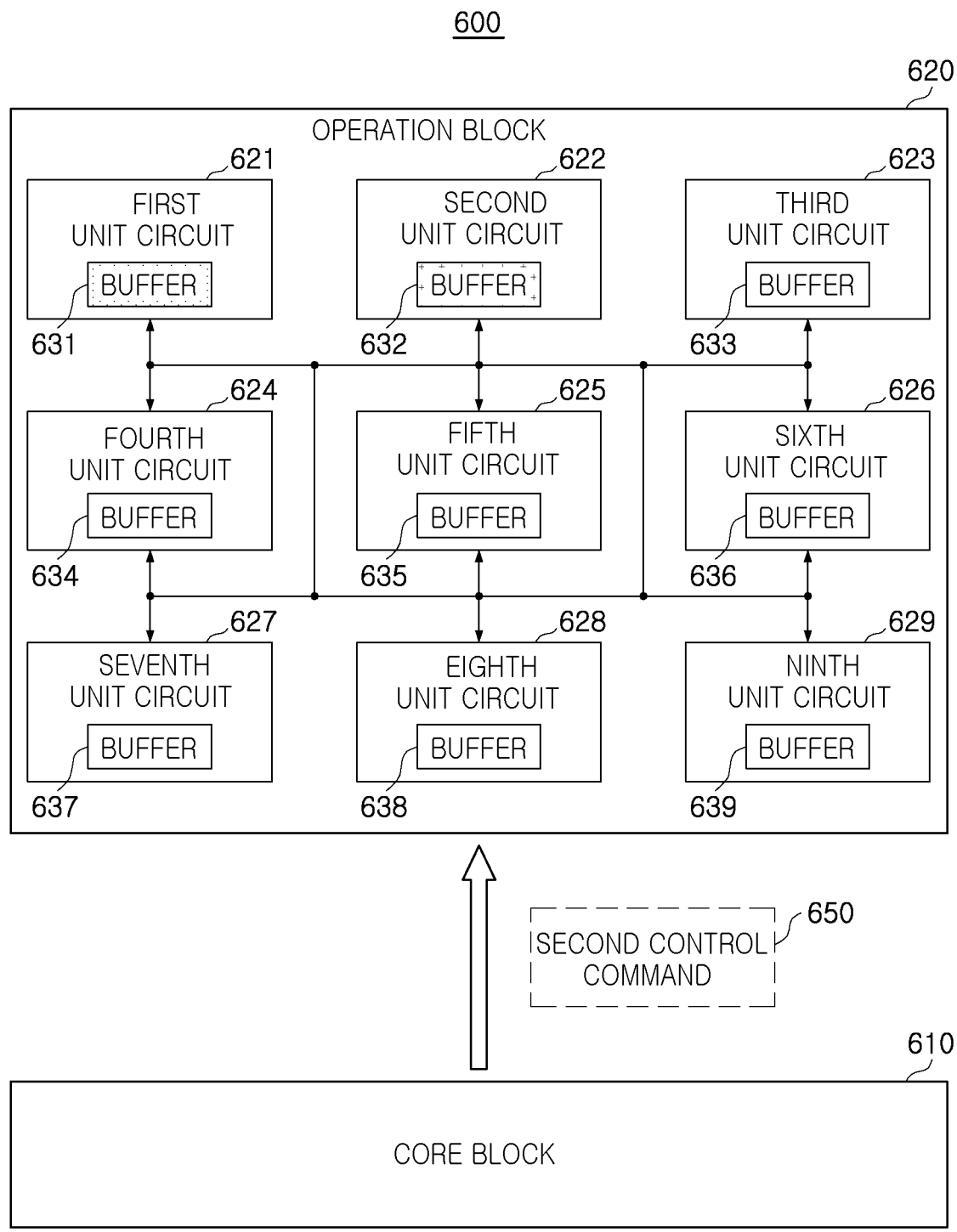

Referring to FIG. 19, the core block 610 may transmit a first control command 640 to the operation block 620. For example, a second unit circuit 622 may operate first in response to the first control command 640, and data required for processing a task required by the first control command 640 may be stored in a buffer 632 of the unit circuit 622. Referring to FIG. 20, the second unit circuit 622 processes a task required by the first control command 640 and then transmits the first control command 640 to the first unit circuit 621 which should be operated subsequently.

In the example embodiment illustrated in FIG. 20, the core block 610 may transmit a second control command 650 to the operation block 620, subsequently to the transmission of the first control command 640. For example, the first control command 640 and the second control command 650 may be commands for requesting the same task to the operation block 620. The second unit circuit 622 may process a task requested by the first control command 640 and then process a task requested by the second control command 650. Referring to FIG. 20, data required for processing a task required by the second control command 650 is stored in the buffer 632 of the second unit circuit 622, and the second unit circuit 622 may operate. Simultaneously therewith, data required for processing a task required by the first control command 640 is stored in the buffer 631 of the first unit circuit 621, and the first unit circuit 621 may operate. Accordingly, the first and second control commands 640 and 650 sequentially received from the core block 610 may be processed in the operation block 620 in parallel at the same time.

Figure 21:
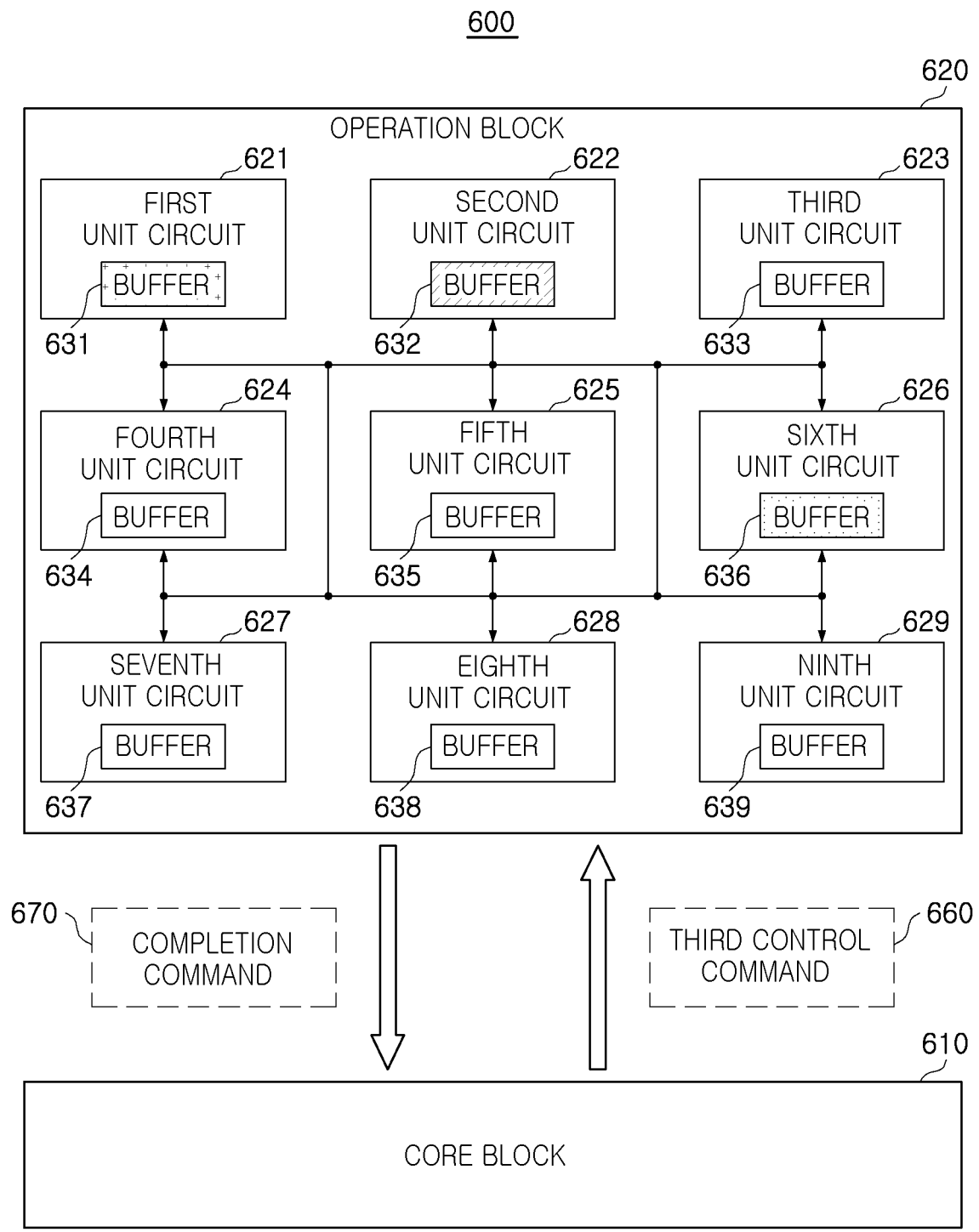

Referring to FIG. 21, a third control command 660 may be transmitted from the core block 610 to the operation block 620, following the second control command 650. The third control command 660 may be a command for requesting a task such as that of the first control command 640 and the second control command 650 to the operation block 620. Referring to FIGS. 20 and 21, the first unit circuit 621 may operate by receiving the second control command 650 from the second unit circuit 622, and a sixth unit circuit 626 may operate by receiving the first control command 640 from the first unit circuit 621. The second unit circuit 622 may operate in response to the third control command 660 received from the core block 610.

Unlike the description with reference to FIGS. 18 to 21, each of the buffers 631 to 639 may have a plurality of storage spaces. In the case in which the buffers 631 to 639 have a plurality of storage spaces, a relatively larger number of control commands may be processed in parallel in the operation block 620. Each of the control commands has a sequence identifier, and when a task requested by a specific control command is completed in the operation block 620, the operation block 620 may generate a completion command 670 having the same sequence identifier as that of the control command at which the task has been completed, and may return the completion command to the core block 610. By providing a plurality of storage spaces in each of the buffers 631 to 639, different tasks requested by control commands may be simultaneously processed in parallel in the operation block 620.

As set forth above, according to an example embodiment, a plurality of unit circuits executing a predetermined function or operation is included in an operation block, and a core block may select at least portions of the unit circuits and transmit a control command specifying an execution order of the selection unit circuits to the operation block. In the operation block, the unit circuits selected by the control command may operate as an accelerator by processing data in accordance with the execution order of the control command. Accordingly, a memory controller, which may operate adaptively to various memory devices and may provide accelerators with various functions, and a storage device including the memory controller, are provided.

While example embodiments have been illustrated and described above, it will be apparent to those skilled in the art that modifications and variations could be made without departing from the scope of the present disclosure as defined by the appended claims.

What is claimed is:

1. A storage device comprising:
a memory device comprising a plurality of memory cells and a plurality of word lines connected to the plurality of memory cells, wherein each memory cell of the plurality of memory cells is configured to store data having a plurality of bits; and
a memory controller comprising an operation block, wherein the operation block comprises a plurality of unit circuits and a core block configured to execute a control operation on the plurality of memory cells in response to a host command from a host, and each unit circuit of the plurality of unit circuits is configured to execute a predetermined function,
wherein the core block is configured to:
select at least a portion of the plurality of unit circuits as selection unit circuits, and
generate a control command specifying an operation order of the selection unit circuits, wherein the control command comprises a number of times of use of the memory device, and
wherein the selection unit circuits are configured to:
operate by the operation order to determine, based on the number of times of use, a control voltage, and
store the control voltage in at least one of the memory controller or the memory device.

2. The storage device of claim 1, wherein the control command comprises a first command and a second command, wherein the core block is further configured to sequentially transmit the first command and the second command to the operation block,
wherein the first command and the second command include different data.

3. The storage device of claim 2, wherein the first command comprises at least one of a sequence identifier indicating a transmission order of the control command, a counter corresponding to the number of times of use of the memory device, and an initial value of the control voltage.

4. The storage device of claim 2, wherein the second command comprises:
an indication of the selection unit circuits, and
an operation sequence of the selection unit circuits.

5. The storage device of claim 2, wherein the operation block is further configured to output, to the core block, a completion command indicating a completion of the control command, when a first operation of a first selection unit circuit of the selection unit circuits is completed, and
wherein the operation order indicates that the first operation of the first selection unit circuit is last among the selection unit circuits.

6. The storage device of claim 5, wherein the completion command comprises the same data as data of the first command.

7. The storage device of claim 5, wherein the control command is a submission queue (SQ) command, and the completion command is a completion queue (CQ) command.

8. The storage device of claim 1, wherein the plurality of unit circuits is configured to execute different functions, and the different functions comprise at least two of a plus operation, a minus operation, a maximum value operation, a minimum value operation, data retrieval, data writing or a shift operation.

9. The storage device of claim 1, wherein at least one of the memory controller and the memory device comprises:
a plurality of counter tables configured to store predicted values of the control voltage, wherein the predicted values are based on the number of times of use of the memory device, and
a data table configured to store a set of values of the control voltage, wherein the set of values is associated with at least a portion of the plurality of memory cells.

10. The storage device of claim 9, wherein the operation block is further configured to:
determine, in response to the control command, the set of values of the control voltage, and
update the data table based on the set of values.

11. The storage device of claim 1, wherein each unit circuit of the plurality of unit circuits is connected to all other unit circuits of the plurality of unit circuits.

12. The storage device of claim 1, wherein each unit circuit of the plurality of unit circuits comprises a buffer having at least one storage space.

13. The storage device of claim 1, wherein the plurality of unit circuits are configured to operate based on a code represented in a hardware form at an RTL level or at a gate level.

14. A storage device comprising:
a memory device comprising:
a plurality of memory cells;
a plurality of word lines connected to the plurality of memory cells; and
a plurality of counter tables configured to store prediction values of a control voltage based on a number of times of use of the memory device, each memory cell of the plurality of memory cells being configured to store data having a plurality of bits;
a core block configured to output a control command, the control command comprising initial values of the control voltage of a target word line among the plurality of word lines and a number of times of actual use of the memory device; and
an operation block configured to:
select, based on the number of times of actual use of the memory device, the prediction values from one counter table of the plurality of counter tables, and
determine, in response to the control command, a set of values of the control voltage of the target word line by adding differences between the initial values and the prediction values to reference values of the control voltage of a reference word line.

15. The storage device of claim 14, wherein the control voltage is at least one of a program voltage, a read voltage and a pass voltage input to the target word line.

16. The storage device of claim 14, wherein the operation block is configured to write the set of values of the control voltage in a storage space different from the plurality of counter tables.

17. The storage device of claim 14, wherein the operation block comprises:
a first unit circuit configured to select the prediction values from the plurality of counter tables,
a second unit circuit configured to determine the differences between the initial values and the prediction values selected by the first unit circuit,
a third unit circuit configured to determine the set of values by adding the differences determined by the second unit circuit to the reference values, and
a fourth unit circuit configured to write the set of values determined by the third unit circuit in a storage space inside the memory device.

18. The storage device of claim 17, wherein the operation block further comprises at least one unit circuit performing a fifth function different from each of a first function of the first unit circuit, a second function of the second unit circuit, a third function of the third unit circuit, and a fourth function of the fourth unit circuit.

19. A memory controller comprising:
a core block configured to sequentially output commands comprising:
a first control command for adjusting a first control voltage with respect to a first number of times of use of a first selected memory cell among a plurality of memory cells, and
a second control command for adjusting a second control voltage with respect to a second number of times of use of a second selected memory cell among the plurality of memory cells; and
an operation block comprising:
a first unit circuit configured to, in response to the first control command, execute a first operation during a first operation time, and
a second unit circuit configured to execute, in response to the second control command, a second operation different from the first operation during the first operation time of executing the first operation by the first unit circuit.

20. The memory controller of claim 19, wherein the first unit circuit is further configured to, in response to the second control command, execute the first operation during a second operation time after the first operation time.

* * * * *